(12) United States Patent
Kato et al.

(10) Patent No.: US 9,777,369 B2
(45) Date of Patent: Oct. 3, 2017

(54) METHOD OF DEPOSITING A FILM, RECORDING MEDIUM, AND FILM DEPOSITION APPARATUS

(71) Applicant: Tokyo Electron Limited, Tokyo (JP)

(72) Inventors: Hitoshi Kato, Iwate (JP); Masahiro Murata, Iwate (JP); Kentaro Oshimo, Iwate (JP); Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 284 days.

(21) Appl. No.: 14/303,763

(22) Filed: Jun. 13, 2014

(65) Prior Publication Data

US 2015/0004332 A1 Jan. 1, 2015

(30) Foreign Application Priority Data

Jun. 26, 2013 (JP) .................................. 2013-134002

(51) Int. Cl.
*C23C 16/00* (2006.01)
*C23C 16/34* (2006.01)
*H01J 37/32* (2006.01)
*C23C 16/455* (2006.01)

(52) U.S. Cl.
CPC ...... *C23C 16/345* (2013.01); *C23C 16/45536* (2013.01); *C23C 16/45557* (2013.01); *H01J 37/321* (2013.01); *H01J 37/32449* (2013.01); *H01J 37/32623* (2013.01); *H01J 37/32651* (2013.01); *H01J 37/32715* (2013.01); *H01J 37/32779* (2013.01); *H01J 37/32816* (2013.01)

(58) Field of Classification Search
CPC ......... C23C 16/50; C23C 16/54; C23C 16/52; C23C 16/345
See application file for complete search history.

(56) References Cited

U.S. PATENT DOCUMENTS

| | | | | |
|---|---|---|---|---|
| 2005/0255257 A1* | 11/2005 | Choi | ..................... | C23C 16/345 427/585 |
| 2006/0216418 A1* | 9/2006 | Matsuura | .............. | C23C 16/345 427/248.1 |
| 2008/0190886 A1* | 8/2008 | Choi | ...................... | C03C 17/34 216/23 |
| 2008/0254203 A1* | 10/2008 | Zhou | .................... | C23C 16/345 427/74 |

(Continued)

FOREIGN PATENT DOCUMENTS

JP 2013-055243 3/2013

*Primary Examiner* — David Turocy
(74) *Attorney, Agent, or Firm* — IPUSA, PLLC

(57) ABSTRACT

A method of depositing a thin film on a substrate inside a vacuum chamber includes a first process that deposits a first film on the substrate, the first process including a process of supplying an active species that is obtained by changing a gas to plasma and is related to a quality of the thin film to the substrate; and a second process that deposits a second film that is the same type as that of the first film on the first film, the second process including a process of supplying the active species to the substrate so that a supply quantity of the active species per a unit film thickness is greater than a first supply quantity of the active species per the unit film thickness in the first process by adjusting a controlled parameter.

11 Claims, 22 Drawing Sheets

(56) References Cited

U.S. PATENT DOCUMENTS

| | | | | |
|---|---|---|---|---|
| 2009/0126634 A1* | 5/2009 | Yamazawa | .......... | C23C 16/5096 |
| | | | | 118/723 R |
| 2011/0155057 A1* | 6/2011 | Kato | ................. | C23C 16/45519 |
| | | | | 118/719 |
| 2012/0052693 A1* | 3/2012 | Ozaki | ................... | C23C 16/402 |
| | | | | 438/771 |
| 2013/0087097 A1* | 4/2013 | Kato | ..................... | H01J 37/321 |
| | | | | 118/663 |
| 2013/0130512 A1* | 5/2013 | Kato | ................. | H01L 21/02274 |
| | | | | 438/765 |

* cited by examiner

FIG.12
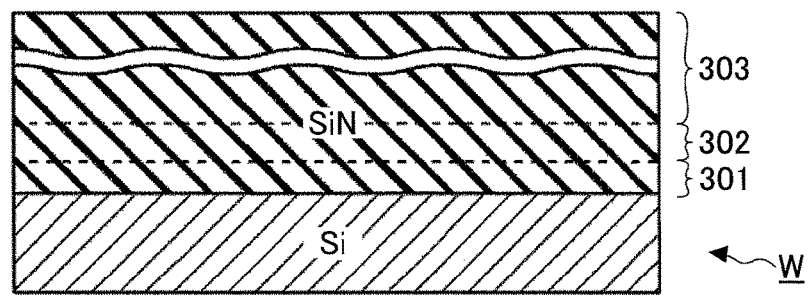
FIG.13
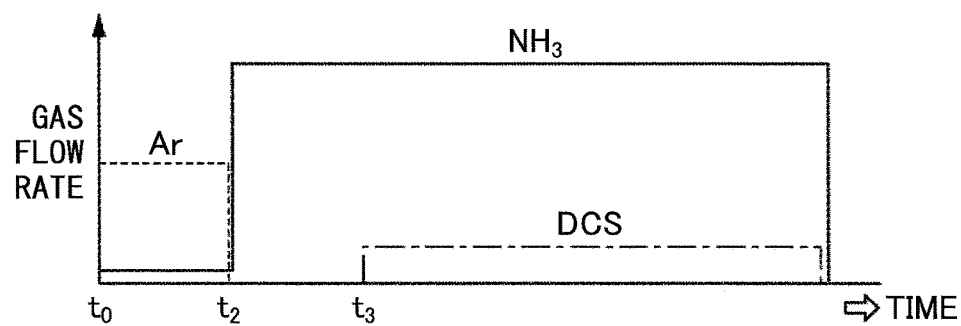
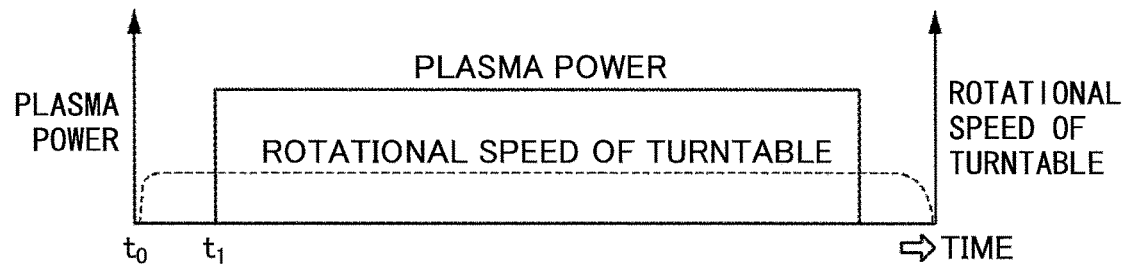

FIRST STEP

SECOND STEP

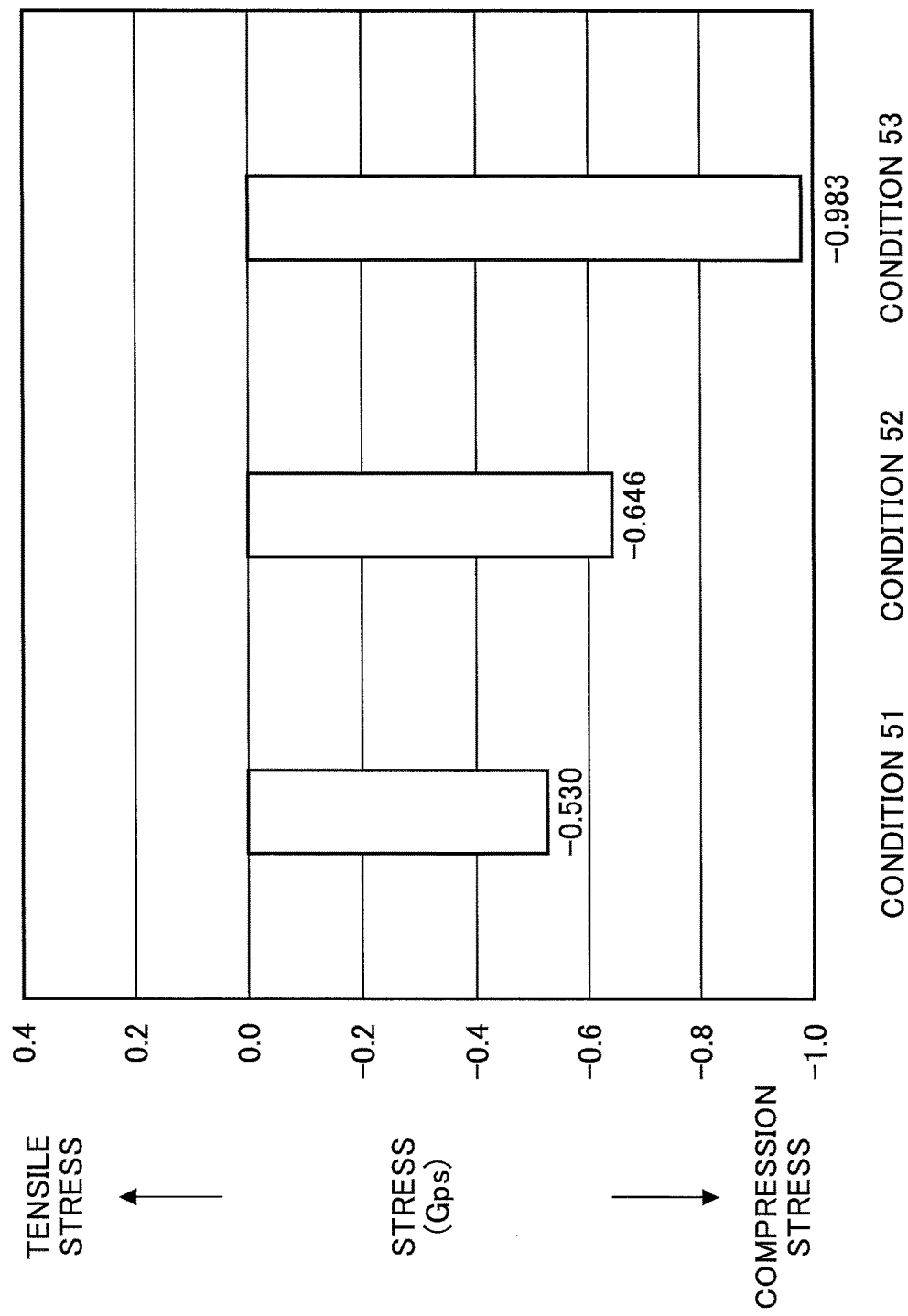

METHOD OF DEPOSITING A FILM, RECORDING MEDIUM, AND FILM DEPOSITION APPARATUS

CROSS-REFERENCE TO RELATED APPLICATIONS

This patent application is based upon and claims the benefit of priority of Japanese Patent Application No. 2013-134002 filed on Jun. 26, 2013, the entire contents of which are incorporated herein by reference.

BACKGROUND OF THE INVENTION

1. Field of the Invention

The present invention relates to a method of depositing a film in that the film is deposited on a substrate using plasma obtained by changing a process gas, a recording medium where the method of depositing a film is recorded, and a film deposition apparatus.

2. Description of the Related Art

As a process of depositing a film on a semiconductor wafer (hereinafter, referred to as a "wafer"), there is a method called an Atomic Layer Deposition (ALD) method where a deposition gas and a reaction gas are alternately supplied multiple times. This ALD method has an advantage in that the formed film is dense and there is an advantage in that an embedding property is good. By changing the deposition gas and the reaction gas to plasma, a thin film having few impurities and high density is obtainable.

Meanwhile, a good film having a high density has a high stress. Therefore, there is a case where a difference between the stress of the film and a stress of an underlayer film becomes great. Therefore, in a case where a high quality is required for the thin film, there is a possibility that the thin film peels from the underlayer film. Therefore, a method of avoiding this possibility is desired.

Japanese Laid-open Patent Publication No. 2013-55243 describes a method of supplying two types of reaction gases that mutually react are sequentially supplied to an orbitally revolving wafer and performing plasma alternation of a reaction product on the wafer in course of a path where the wafer orbitally revolves. However, the above problem is not considered.

SUMMARY OF THE INVENTION

Accordingly, embodiments of the present invention may provide a novel and useful method of depositing a film, a recording medium, and a film deposition apparatus solving one or more of the problems discussed above.

The embodiments of the present invention are provided in consideration of the above. The object of the present invention is to provide a technique where a thin film having a good film quality is obtained, and the film is prevented from peeling from the underlayer film.

According to an aspect of the present invention, there is provided a method of depositing a thin film on a substrate inside a vacuum chamber including a first process that deposits a first film on the substrate, the first process including a process of supplying an active species that is obtained by changing a gas to plasma and is related to a quality of the thin film to the substrate; and a second process that deposits a second film that is the same type as that of the first film on the first film, the second process including a process of supplying the active species to the substrate so that a supply quantity of the active species per a unit film thickness is greater than a first supply quantity of the active species per the unit film thickness in the first process by adjusting a controlled parameter.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 12 is a vertical cross-sectional view schematically illustrating the function of the film deposition apparatus;

FIG. 13 illustrates characteristic charts of an exemplary sequence at a time of depositing a nitride silicon film using an exemplary method;

FIG. 28 is a characteristic chart illustrating results obtained by the embodiment of the present invention; and

DETAILED DESCRIPTION OF EMBODIMENTS

A description of a method of forming a film and a film deposition apparatus for performing the method is given below, with reference to the figures of the embodiments of the present invention. In the embodiments described below, the reference symbols typically designate as follows:

W: wafer;
1: vacuum chamber;
2: turntable;
P1, P2: process area;
31, 32: gas nozzle;
80: plasma process portion;
83: antenna;
302: first film; and
303: second film.

Referring to FIGS. 1 to 4, the film deposition apparatus includes a vacuum chamber 1 having a circular shape in its plan view and a turntable 2 that is freely rotatable around a vertical axis inside the vacuum chamber 1. The film deposition apparatus is structured to perform a process of depositing a film made of silicon on a wafer W by an ALD method using plasma of a process gas. As described in detail later, even if a silicon nitride film, which is hard to be in contact with the wafer being an underlayer, is used, the silicon nitride film can be preferably in contact with the surface of the wafer W and can be deposited while maintaining a good film quality. Next, before describing the method of depositing the film in detail, the film deposition apparatus can be briefly explained.

Figure 1:
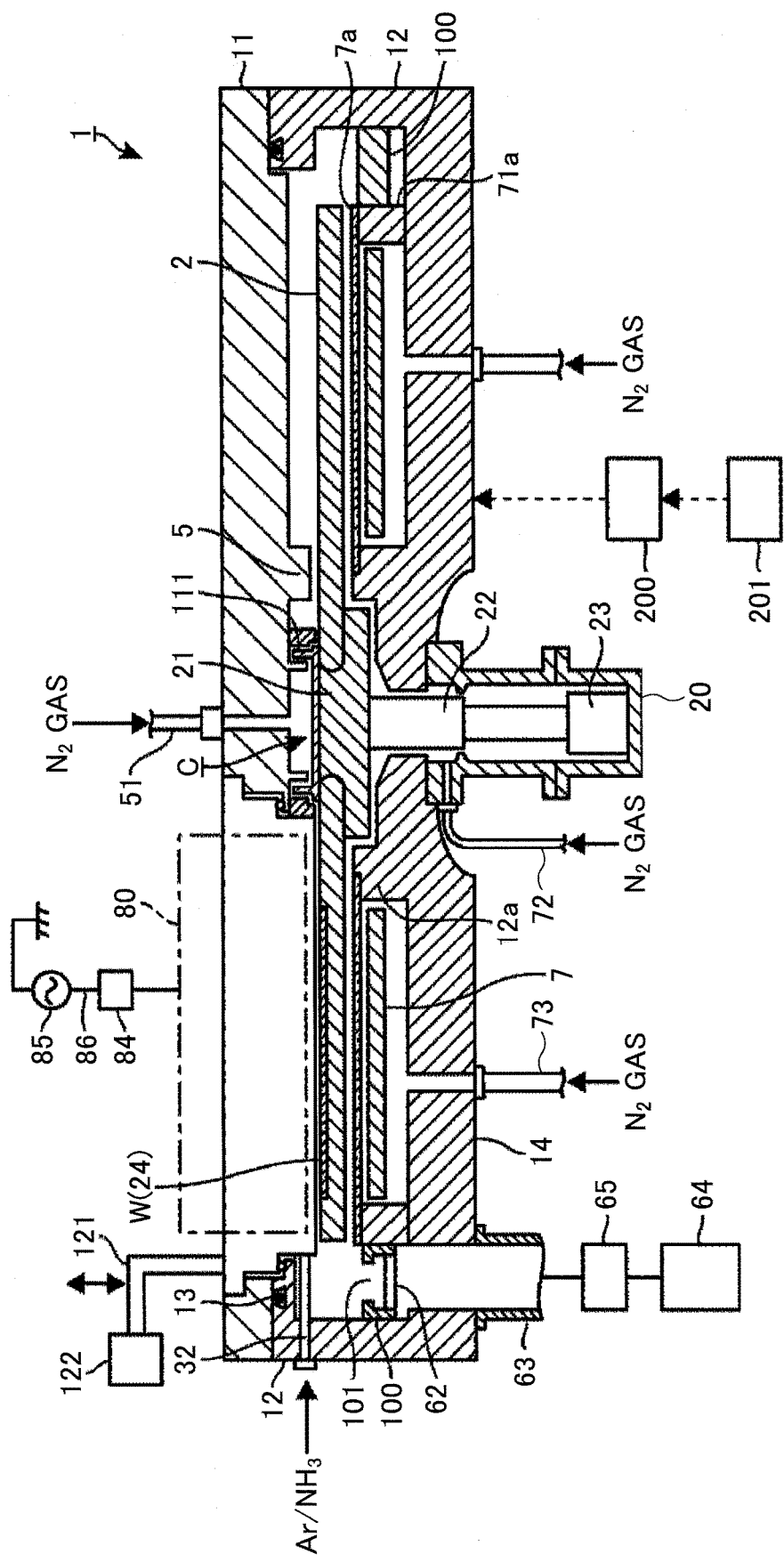
FIG. 1 is a vertical cross-sectional view illustrating an exemplary film deposition apparatus of an embodiment of the present invention.

The vacuum chamber 1 includes a chamber body 12 and a ceiling plate 11, which is attachable to and detachable from the chamber body 12. A separation gas supplying pipe 51 is connected to a center portion on an upper surface side of the ceiling 11. A separation gas such as a nitrogen gas (a $N_2$ gas) is supplied from the separation gas supplying pipe 51 to prevent different process gases from mixing in a center area C inside the vacuum chamber 1. Referring to FIG. 1, a reference symbol 13 provided along a peripheral portion on an upper surface of the chamber body 12 is a sealing member. The sealing member 13 is, for example, an O ring.

Referring to FIG. 1, a heater unit 7 being a heating mechanism is provided above the bottom portion 14 of the vacuum chamber 1. The heater unit 7 is structured to heat the wafer W on the turntable 2 to have a film deposition temperature of, for example, 200° C. to 450° C. through the turntable 2. Referring to FIG. 1, a side of the heater unit 7 is covered by a cover member 71a, and an upper side of the heater unit 7 is covered by a cover member 7a. A purge gas supplying pipe 73 is provided to purge a nitrogen gas from a lower side of heater unit 7.

A center portion of turntable 2 is fixed to a core portion 21 substantially in a cylindrical shape. A rotational shaft 22 extending in a vertical direction is connected to the lower surface of the core portion 21. In this example, the turntable 2 is freely rotatable in a clockwise direction around a vertical axis by the rotational shaft 22. Referring to FIG. 1, a driving unit (a rotational mechanism) 23 is provided to rotate the rotational shaft 22 around the vertical axis, and a case body 20 accommodates the rotational shaft 22 and the driving unit 23. A flange portion of the case body 20 on an upper surface side of the case body 20 is hermetically attached to the lower surface of the bottom portion 14 of the vacuum chamber 1. A purge gas supplying pipe 72 is connected to a lower area of the turntable 2 so as to supply a nitrogen gas as a purge gas into a lower area of the turntable 2. The outer peripheral side of the core portion 21 in the bottom portion 14 of the vacuum chamber 1 is formed like a ring-shaped protrusion portion 12a in the vicinity of the lower side of the turntable 2.

Figure 2:
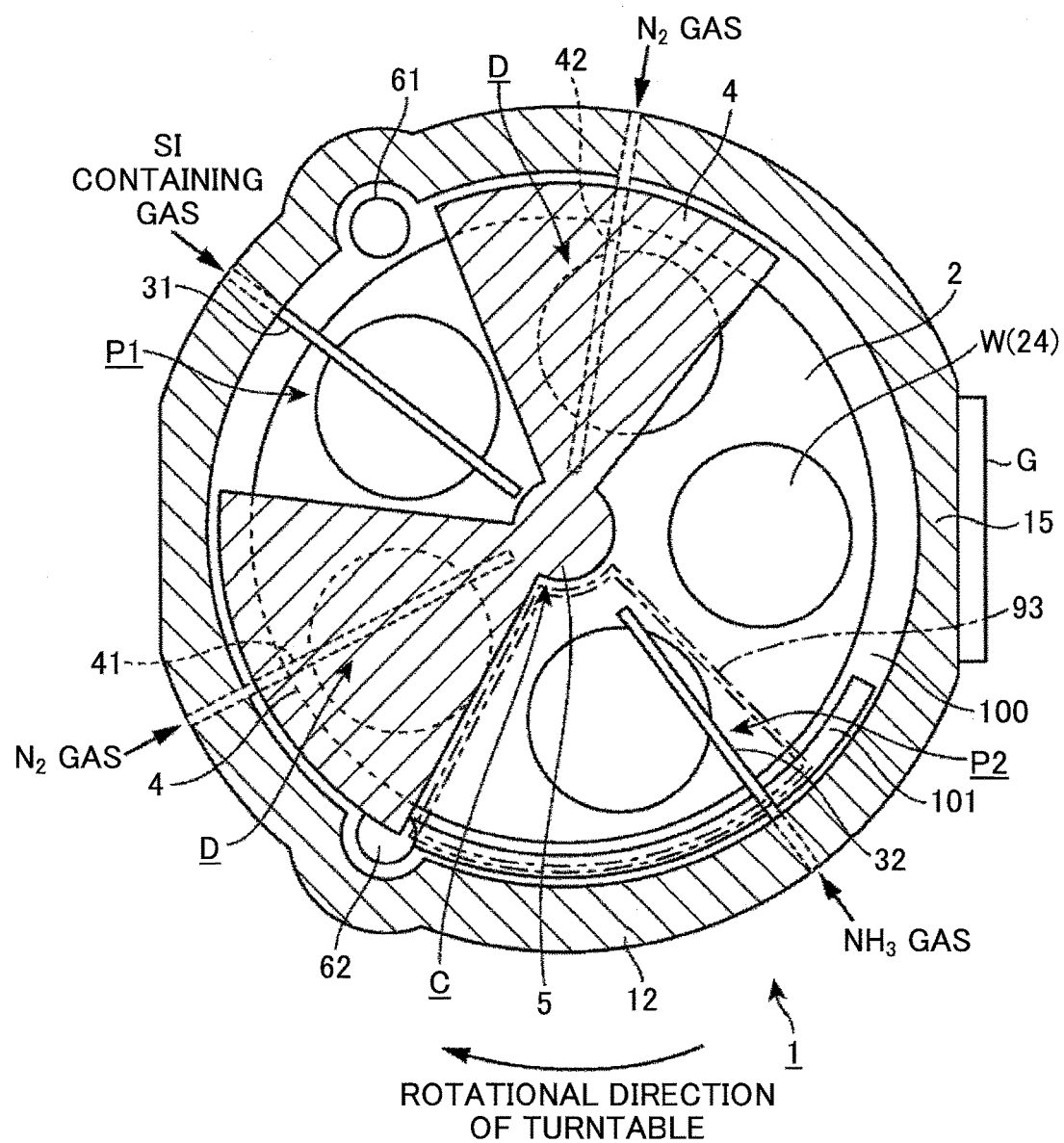
FIG. 2 is a horizontal cross-sectional plan view of the film deposition apparatus.
Figure 3:
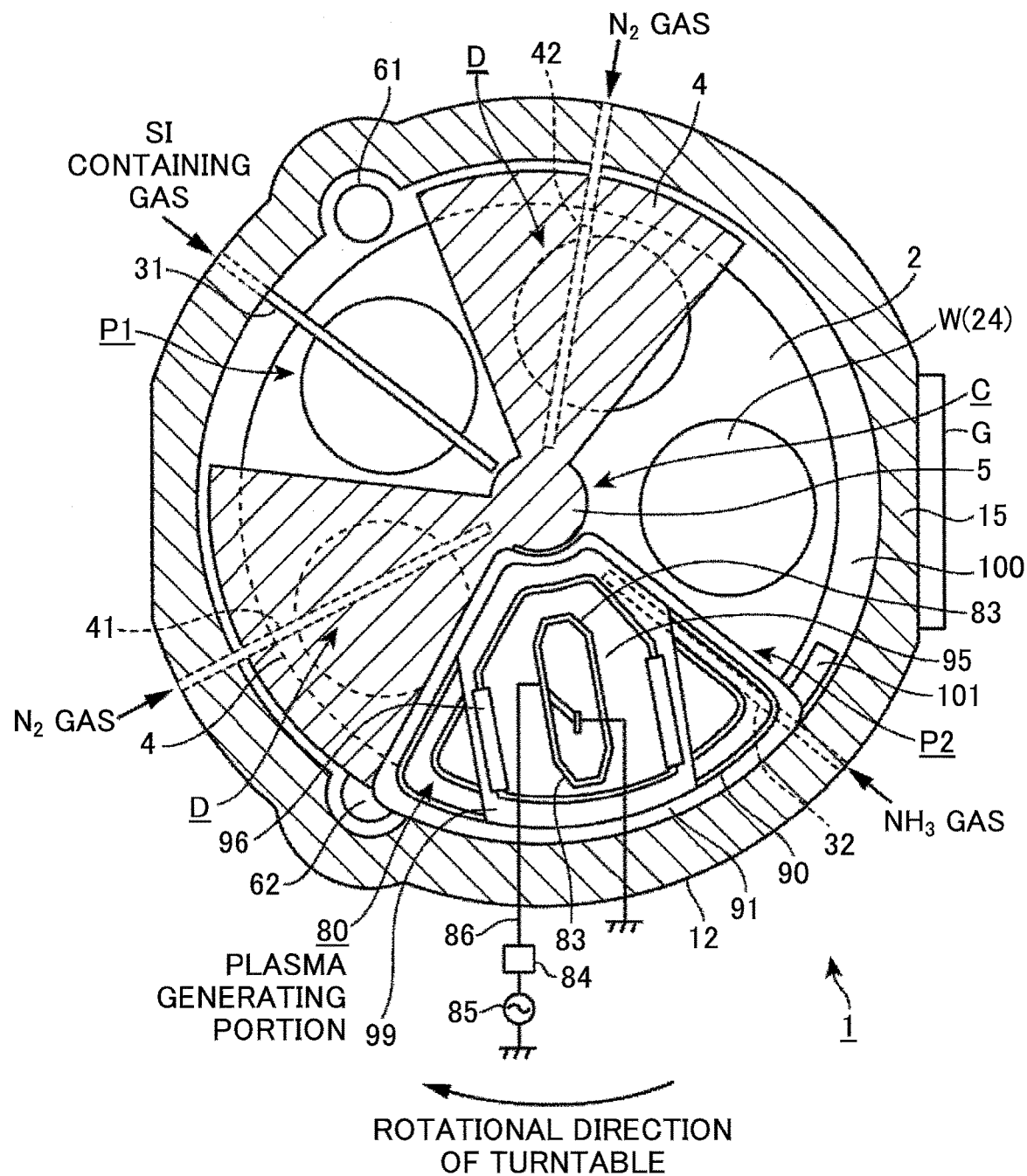
FIG. 3 is a horizontal cross-sectional plan view of the film deposition apparatus.

Referring to FIGS. 2 and 3, a plurality of circular recesses 24 are provided on the surface of the turntable 2 as substrate mounting areas to receive and hold the wafers W. The plurality of recesses 24 is located at five positions along a rotational direction of the turntable 2. At positions of the turntable 2 facing a locus area of the recesses 24, four nozzles 31, 32, 41, and 42 are radially arranged while mutually interposing intervals in the peripheral direction of the vacuum chamber 1. These nozzles 31, 32, 41, and 42 are attached to, for example, an outer peripheral wall of the vacuum chamber 1 so as to horizontally extend toward the center area C while facing the wafers W. In this example, a first process gas nozzle 32 simultaneously functioning as a plasma generation gas nozzle, a separation gas nozzle 41, a first process gas nozzle 31, and a separation gas nozzle 42 are arranged in this order in a clockwise direction (the rotational direction of turntable) from a transfer opening described below.

The first process gas nozzle 31 functions as a first process gas supplying portion, and the second process gas nozzle 32 functions as a second process gas supplying portion and a plasma generation gas supplying portion. The separation gas nozzles 41 and 42 function as separation gas supplying portions. FIG. 2 illustrate a state where a plasma process portion 80 and a casing 90 (described below) are removed so that the second process gas nozzle 32 can be observed. FIG. 3 illustrates a state where the plasma process portion 80 and the casing 90 are attached. Referring to FIG. 3, slits 97 described below are omitted from illustration.

The nozzles 31, 32, 41, and 42 are connected to corresponding gas supplying sources (not illustrated) through flow rate adjusting valves. Namely, the first process gas nozzle 31 is connected with a supplying source of a first process gas containing silicon (Si) such as a dichlorosilane (DCS) gas. The second process gas nozzle 32 is connected with supplying sources of the second process gas containing nitrogen and a supplying source of a plasma generating gas for generating plasma. The second process gas is, for example, an ammonia ($NH_3$) gas. The plasma generating gas is at least one of an argon (Ar) gas, a helium (He) gas, and a hydrogen ($H_2$) gas. The separation gas nozzles 41 and 42 are connected to corresponding gas supplying sources for supplying a separation gas, namely a nitrogen gas. Gas discharging ports 33 are formed on the lower surface sides of the gas nozzles 31, 32, 34, 41, and 42. The gas discharging ports 33 are arranged at an equal interval and at a plurality of locations along a radius direction of the turntable 2.

Lower areas below the process gas nozzles 31 and 32 are a first process area P1 and a second process area P2. The first process area P1 is provided to cause the first process gas to adsorb onto the wafers W. The second process area P2 is provided to cause the components of the first process gas adsorbing onto the wafers W to react the second process gas. The separation gas nozzles 41 and 42 are provided to form separating areas D for separating the first process area P1 and the second process area P2. Referring to FIG. 2 and FIG. 3, the ceiling plate 11 of the vacuum chamber 1 has a convex portion 4 substantially in a sector-like shape. The separation gas nozzles 41 and 42 are accommodated in the convex portion 4. Therefore, lower ceiling surfaces that are the lower surfaces of the convex portions 4 are arranged on the both sides of each of the separation gas nozzles 41 and 42 in the peripheral direction of the turntable 2 to prevent the process gases from mixing. Higher ceiling surfaces higher than the lower ceiling surfaces are arranged on both sides of the ceiling surfaces in the peripheral directions. Peripheral portions of the convex portions 4 (portions on aside of an outer edge of the vacuum chamber 1) faces the surface of the turntable 2 at an outer edge surface and is slightly apart from the chamber body 12. The peripheral portions of the convex portions 4 are bent in a shape like L so as to prevent the processing gases from mixing.

Figure 4:
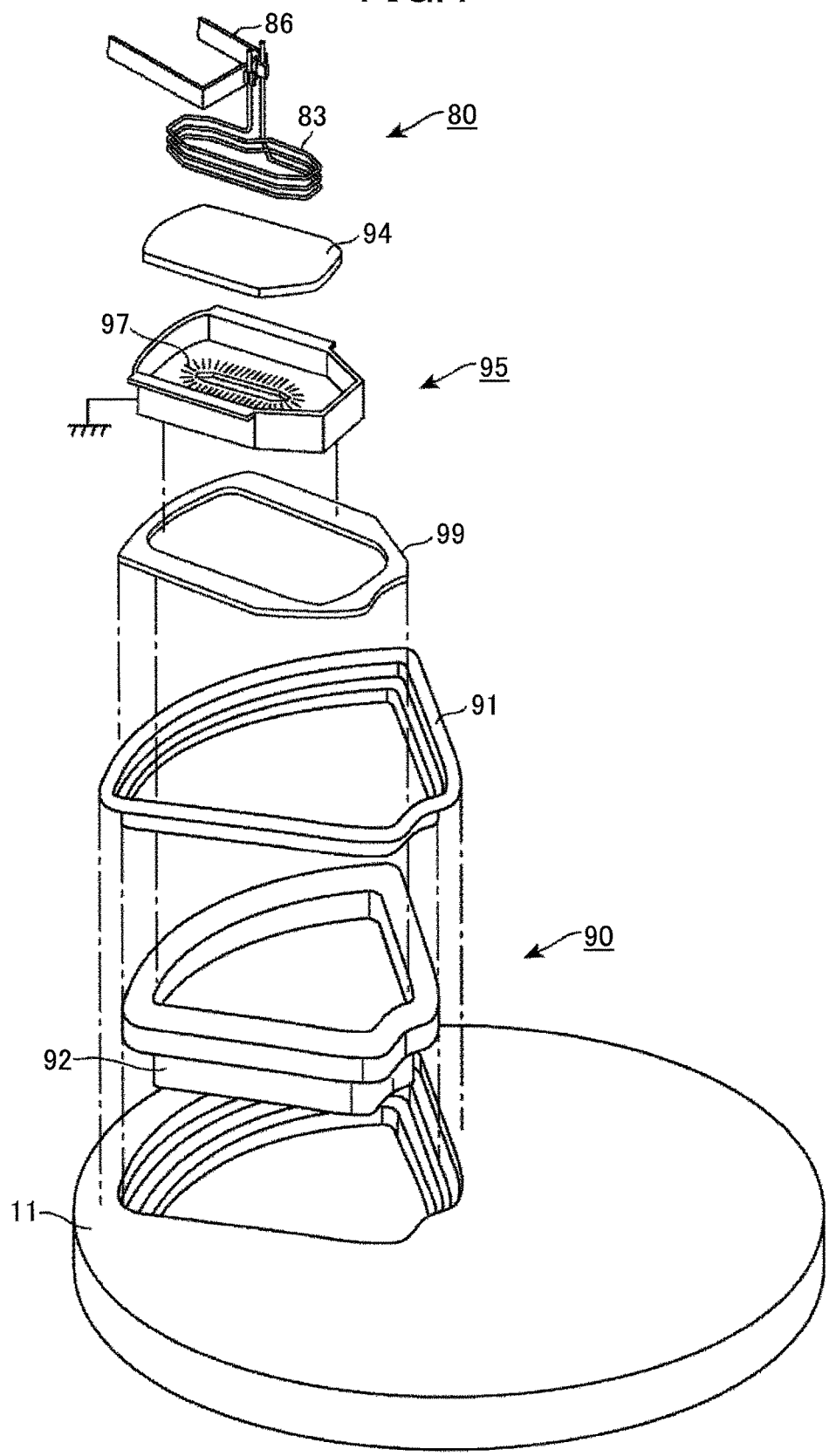
FIG. 4 is an exploded perspective view illustrating a part of the film deposition apparatus.

Next, the above plasma process portion 80 is described. Referring to FIGS. 3 and 4, the plasma process portion 80 is formed by winding the antenna (a power supplying portion) 83 made of a metal wire around a vertical axis so as to be shaped like a coil. When the plasma process portion 80 is viewed in a plan view, the plasma process portion 80 is arranged so as to bridge over the locus area of the wafers W from the center portion side of the turntable 2 to the outer periphery side of the turntable 2. The antenna 83 is connected with a frequency power source 85, which has a frequency of, for example, 13.56 MHz and an output power of, for example, 5000 W, through a matching box 84 and is arranged so as to be hermetically separated from the inner area of the vacuum chamber 1. Said differently, the ceiling plate 11 is opened in its plan view on the upper side of the second process gas nozzle 32 and is hermetically sealed by the casing 90 made of, for example, quartz. The upper peripheral edge portion of the casing 90 horizontally extends like a flange in the peripheral direction of the casing 90. Further, the central portion of the casing 90 is recessed toward the inner area of the vacuum chamber 1. The antenna 83 is accommodated inside the casing 90. Referring to FIG. 1, a pressing member 91 downward pushes the peripheral edge portion of the casing 90. A connection electrode 86 electrically connects the plasma processing portion 80, the matching box 84, and the high frequency power source 85.

The lower surface of the casing 90 forms a protruding portion 92 for regulating a gas. The protruding portion 92 prevents the nitrogen gas or the ammonia gas from intruding into the lower area of the casing 90. For this, referring to FIG. 5, the outer edge portion vertically protrudes onto the lower side (a side of the turntable 2) along its periphery. The above-described plasma generating gas nozzle 32 is accommodated in an area surrounded by the inner peripheral surface of the protruding portion 92, the lower surface of the casing 90, and the upper surface of the turntable 2. A surrounding member 93 that is substantially in an annular shape and is made of, for example, quartz is provided to further surround an area surrounded by the protruding portion 92 is provided on the outside of the protruding portion 92. The surrounding member 93 is attached to a portion of, for example, the ceiling plate 11 on a center side of the turntable 2. Even if the casing 90 is apart from the turntable 2 on the upper side through the driving unit 122 described below, the film deposition apparatus is formed such that the nitrogen gas or the ammonia gas can be prevented from intruding onto the lower side of the casing 90. Referring to FIG. 2, the surrounding member 93 is indicated by a dot chain line.

Figure 5:
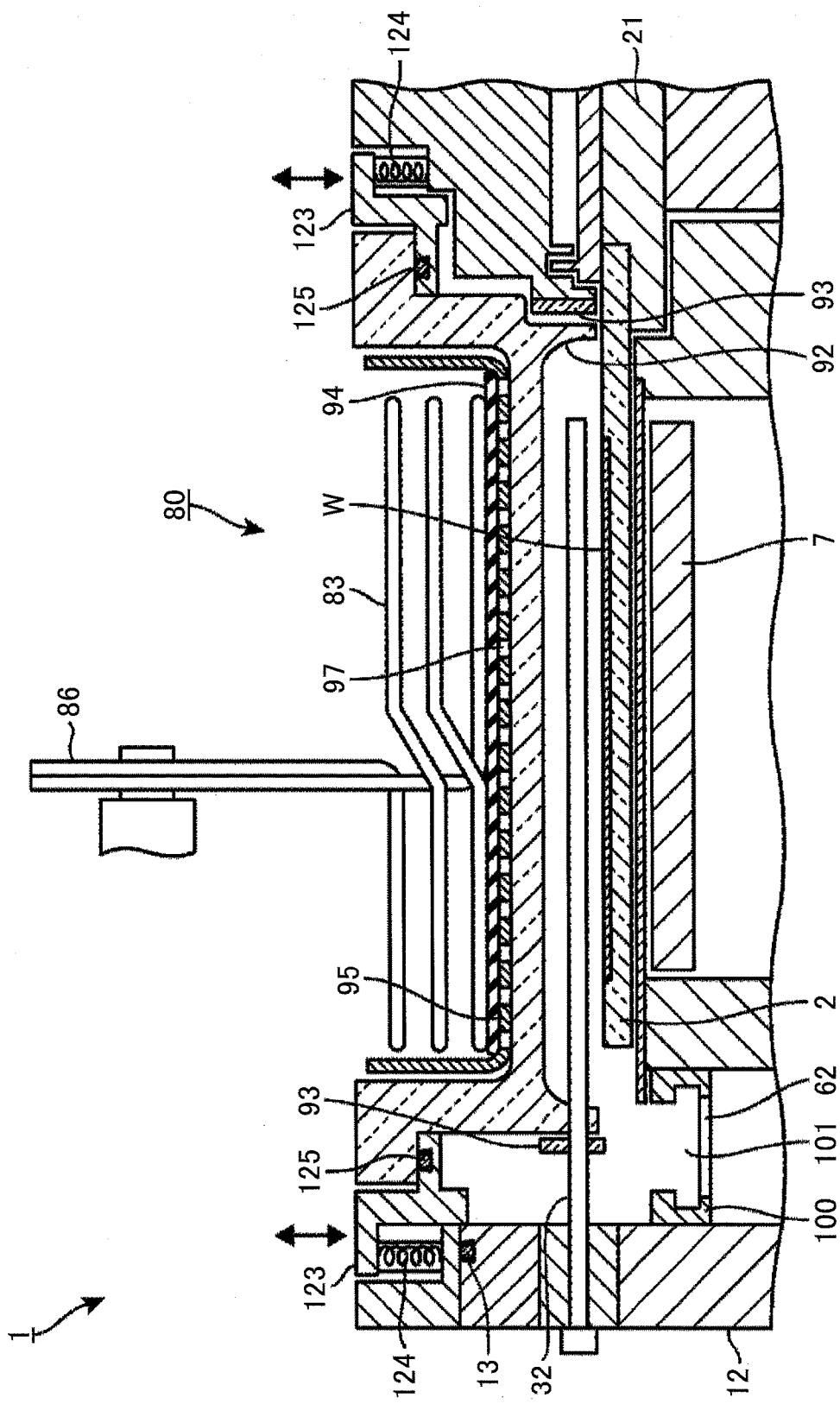
FIG. 5 is a vertical cross-sectional plan view of the exemplary film deposition apparatus.

Referring to FIGS. 4 and 5, a faraday shield 95 that has an opening on the upper surface side and is substantially shaped like a box is arranged between the casing 90 and the antenna 83. The Faraday shield 95 is formed by a metallic plate that is a conductive plate-like member and is grounded. The slits 97 are formed on the bottom surface of the Faraday shield 95. The slits 97 are formed to prevent an electric component, which is included in an electric field and a magnetic field (an electromagnetic field), from directing the wafer W provided on the lower side of the slits 97 and to cause the magnetic field to reach the wafer W. The slits 97 are formed so as to extend in a direction orthogonal to the direction of winding the antenna 83 and are provided at a position below the antenna 83 and in the peripheral directions of the antenna 83 so as to be provided along the length direction of the antenna 83. An insulating plate 94 made of, for example, quartz intervenes between the Faraday shield 95 and the antenna 83 to insulate the Faraday shield 95 from the antenna 83.

Referring to FIG. 1, an up-and-down shaft 121 extending from the driving unit 122 is connected with the upper surface of the above-described casing 90 (specifically, a supporting member 123 described below) to integrally move the Faraday shield 95 and the insulating plate 94 up and down. It is structured by the driving unit 122 that the height of the lower surface (the antenna 83) of the casing 90 relative to the surface of the turntable 2, namely the plasma intensity in a plasma area formed above the turntable 2, can be adjusted while hermetically maintaining the inside of the vacuum chamber 1. Specifically, the supporting member 123 substantially in an annular-like shape is provided between the casing 90 and the ceiling plate 11, and an outer edge portion on the upper side of the supporting member 123 protrudes outward like a flange in the horizontal direction. A flexible wall 124 in an annular-like shape is provided between the lower surface side of the outer edge portion of the supporting member 123 and the ceiling plate 11 of the vacuum chamber 1. An elastic body such as a spring is hermetically accommodated inside the flexible wall 124, and the upper and lower end surfaces are heretically fixed to the supporting member 123 and the ceiling plate 11. Therefore, even though the casing 90 is moved up and down relative to the turntable 2, the inner region of the vacuum chamber 1 is hermetically maintained. Referring to FIG. 5, a seal member 125 is provided. Referring to FIG. 1, the supporting member 123 and the flexible wall 124 are omitted from illustration.

A side ring 100 in an annular shape is arranged at a position slightly lower than the turntable 2 on the outer peripheral side of the turntable 2. Evacuation ports 61 and 62 are formed so as to be mutually located at two separate positions in a peripheral direction of the side ring 100. The two exhaust ports include a first exhaust port 61 and a second exhaust port 62. The first evacuation port 61 is positioned on a side closer to the separating area D that is positioned on the downstream side of the turntable 2 relative to the first processing gas nozzle 31 in the rotational direction of the turntable 2 between the first processing gas nozzle 31 and the separating area D. The second evacuation port 62 is positioned on a side closer to the separating area D that is positioned on the downstream side of the turntable 2 relative to the second processing gas nozzle 32 in the rotational direction of the turntable 2 between the second processing gas nozzle 32 and the separating area D.

The first evacuation port 61 is provided to evacuate the first process gas and the separation gas. The second evacuation port 62 is provided to evacuate the second process gas and the separation gas. The upper surface of the side ring 100 has a gas flow path 101 in a groove-like shape on the outer edge side of the casing. The gas flow path 101 is provided to cause the gas to flow into the second evacuation port 62 by way of a detour around the casing 90. The first and second evacuation ports 61 and 62 may be connected to a vacuum pump 64 being an evacuating mechanism through evacuation pipes 63 provided with a pressure controller 65 such as a butterfly valve.

Referring to FIG. 3, a protrusion portion 5 is provided at a center portion below the ceiling plate 11. The protrusion portion 10 is substantially shaped like a ring, and is continuously formed from a portion of the center area C of the convex portion 4. The lower surface of the protrusion portion 10 has the same height as the lower surface of the convex portion 4. Wall portions 111 extend from the turntable 2 and the ceiling plate 11 to the ceiling plate 11 and the turntable 2, respectively, above the core portion 21 provided on the side of the rotational center of the turntable 2. The wall portions 111 face each other in a radius direction of the turntable 2 to prevent the first and second process gases from mixing in the center area C.

Referring to FIGS. 2 to 4, a transfer opening 15 is formed in a side wall of the vacuum chamber 1. The transfer opening 15 is provided to serve or receive the wafer W between a transfer arm (not illustrated) located outside the transfer opening 15 and the turntable 2. The transfer opening 15 can be hermetically opened or closed using a gate valve G. Further, a lift pin (not illustrated) for lifting the wafer W from the back surface side of the wafer through a through hole of the turntable 2 is provided on the lower side of the turntable 2 at a position corresponding to the transfer opening 15.

The film forming deposition apparatus includes a control unit 200 having a computer for controlling entire operations of the film deposition apparatus. A program for performing a film deposition process described below is stored in a memory of the control unit 200. The program is made to perform step groups of the following operations of the film deposition, apparatus. The program is installed in the control unit 200 from a memory unit 201 being a recording medium such as a hard disk, a compact disk, a magneto-optical disk, a memory card, and a flexible disk.

Next, functions of the above embodiment are described. As described in detail below, the method of depositing a film of the embodiment of the present invention adopts a measure of depositing thin films using the ALD method where the thin films are separated to upper and lower layers, and a film deposition sequence combining two stages where film deposition conditions on the upper layer side and the lower layer side are respectively applied. The reason why the method of depositing a film using the two stages is adopted is described below along with problems caused in a case where the thin film is deposited by a method of depositing a film using one stage.

Said differently, in a case where a film is deposited by the method of depositing the film using the one stage to deposit a silicon nitride film on the wafer W made of silicon by the ALD method, the first process gas and the second process gas are a silicon containing gas and a nitrogen containing gas, respectively, as described above. Further, the nitrogen containing gas is, for example, an ammonia gas, and the ammonia gas is changed to plasma (is activated) to nitride a silicon component adsorbing on the wafer W. Therefore, it is preferable to enhance a degree where the ammonia gas changes to the plasma as high as possible in order to obtain a good (dense) film quality to an extent that a device formed inside the wafer W is not damaged.

Figure 16:
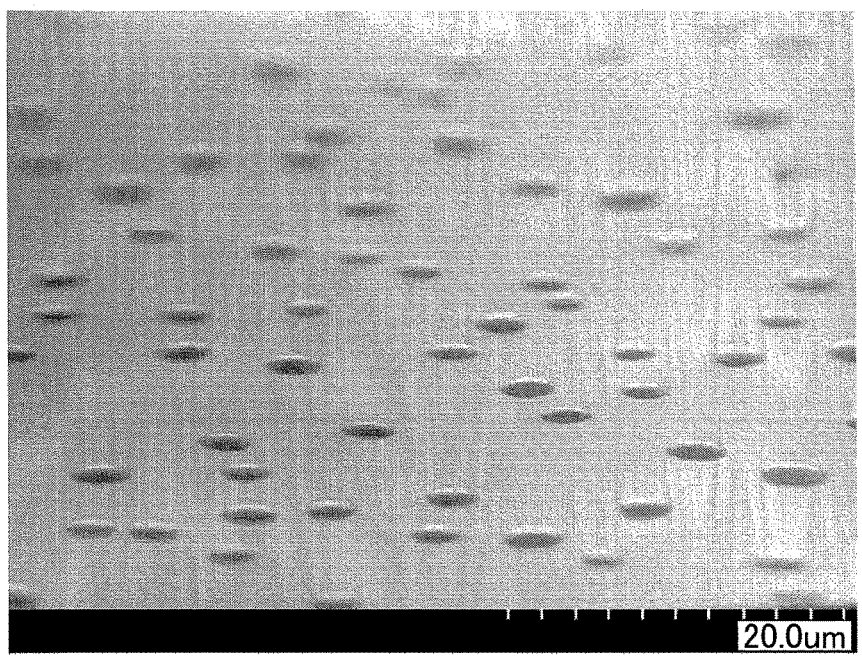
FIG. 16 illustrates a result obtained by the embodiment.
Figure 17:
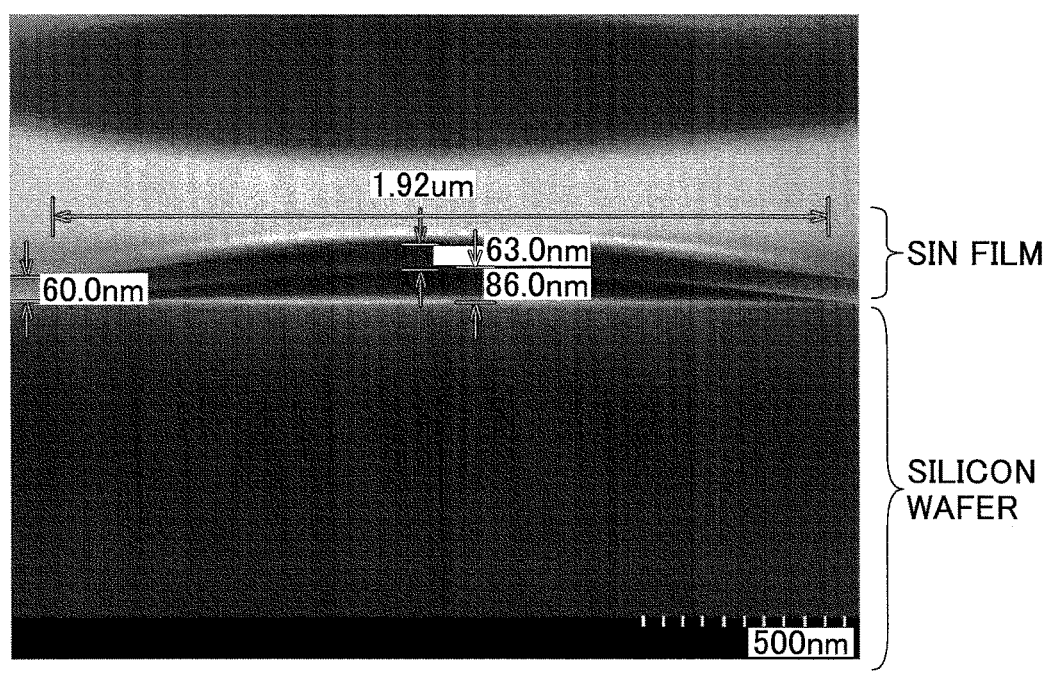
FIG. 17 illustrates a result obtained by the embodiment.

However, the silicon nitride film has an extremely great internal stress in comparison with the silicone layer forming the wafer W. Therefore, as the silicon nitride film is planned to be dense, the above stress becomes great thereby promoting film peeling of the film from the wafer W. FIGS. 16 and 17 are scanning electron microscope (SEM) photographs showing the film peeling of the nitride silicon film. Circular film peeling occurs at many positions on the surface of the wafer W. Therefore, in a case where the silicon nitride film is formed on the wafer W, the improvement of the dense (the density) in the silicon nitride film and the securement of a close contact between the silicon nitride film and the wafer W are in a relationship of trade-off. Then, it becomes extremely difficult to obtain the dense silicon nitride film while suppressing the film peeling.

Figure 6:
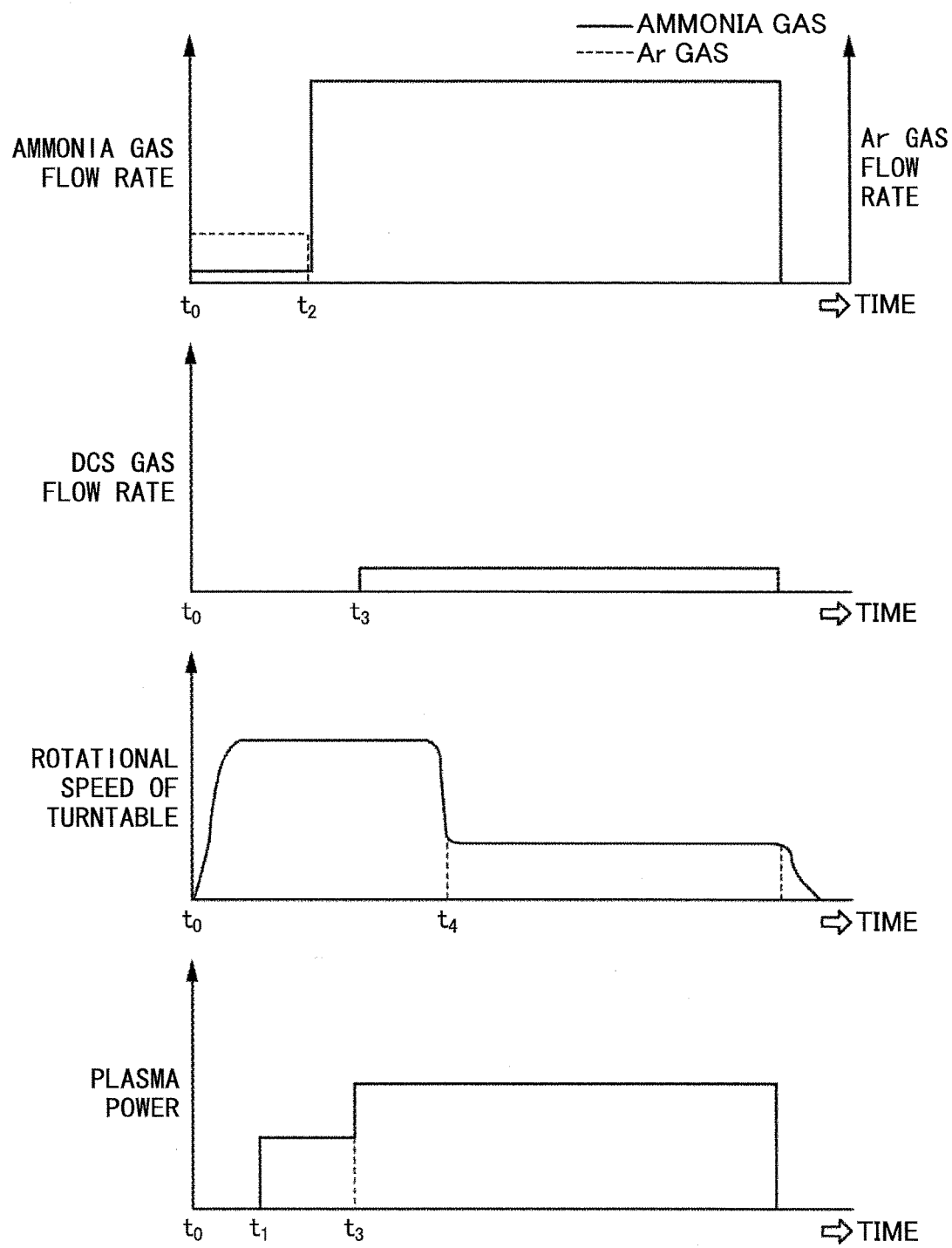
FIG. 6 illustrates characteristic charts of an exemplary sequence at a time of depositing a nitride silicon film using the method of the present invention.

According to the present invention, the method of depositing the film combining the two stages are adopted in order to deposit the dense silicon nitride film while preventing the film from peeling from the wafer W. Hereinafter, the method of depositing the film is described including a specific method of using the film deposition apparatus. At first, the gate valve G illustrated in FIG. 2 is released. While the turntable 2 is intermittently rotated, for example, five wafers W are mounted onto the turntable 2 by the transfer arm (not illustrated) through the transfer opening 15. Next, the gate valve G is closed, and the atmosphere inside the vacuum chamber 1 is completely evacuated by a vacuum pump 64. FIG. 6 is a sequence chart illustrating the method of depositing the film of the embodiment of the present invention. At a time t0, the argon gas and the ammonia gas are supplied at flow rates of 2000 sccm and 3500 sccm from the second process gas nozzle 32 into the vacuum chamber 1, respectively, without supplying power to the antenna 83 and changing the process gas to the plasma while increasing the rotational speed of the turntable 2 to be, for example, 30 rpm. A nitrogen gas is supplied at a predetermined rate from the separation gas nozzles 41 and 42, the separation gas supplying pipe 51, and the purge gas supplying pipes 72 and 72.

Figure 7:
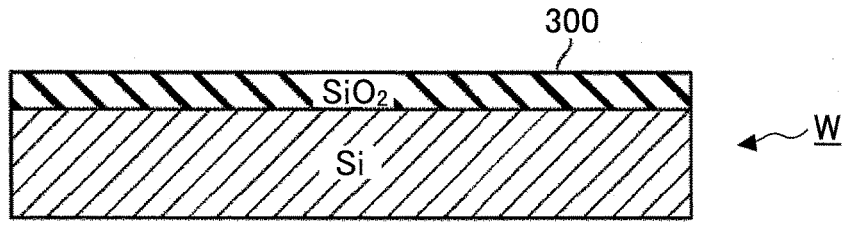
FIG. 7 is a vertical cross-sectional view schematically illustrating a function of the film deposition apparatus.
Figure 8:
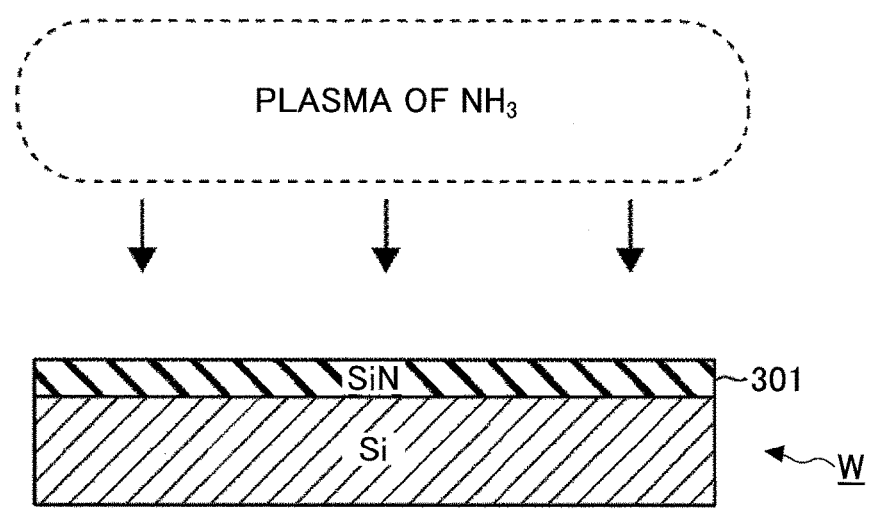
FIG. 8 is a vertical cross-sectional view schematically illustrating the function of the film deposition apparatus.

Subsequently, after the heating temperature of the wafer W heated by the heater unit 7 (see FIG. 1) converges on about, for example, 400° C., the antenna (see FIG. 5) is started to be supplied with power of, for example, 3000 W at a time t1. Then, at a time t2, the supply of the argon gas is stopped and the flow rate of the ammonia gas is increased up to 8000 sccm to nitride the surface of the wafer W. As illustrated in FIG. 7, because the wafer W is carried through an air atmosphere, a natural oxide film 300 is formed on the surface of the wafer W. Therefore, when plasma of the ammonia gas is supplied to the surface of the wafer W, the natural oxide film 300 is nitrided by an active species contained in the plasma thereby forming a nitride layer 301. Until the natural oxide film 300 is removed from the wafer W, namely until the turntable 2 rotates a predetermined number of turns, the nitride process of the natural oxide film 300 is continued.

Figure 9:
FIG. 9 is a vertical cross-sectional view schematically illustrating the function of the film deposition apparatus.

Subsequently, at a time t3, a dichlorosilane gas is started to be supplied into the inside of the vacuum chamber 1, and simultaneously the power supplied to the antenna is increased to 5000 W. A component of the dichlorosilane gas adsorbs onto the surfaces of the wafers W alternately passing through the first and second process areas P1 and P2 by the turntable 2. Then, when the wafer W adsorbing the component of the dichlorosilane gas on its surface reaches the second process area P2, the component is nitride by the plasma (the active species) of the ammonia gas as illustrated in FIG. 9. Thus, the silicon nitride film as the reaction product forming a part of the thin film is formed as the first film 302.

Figure 10:
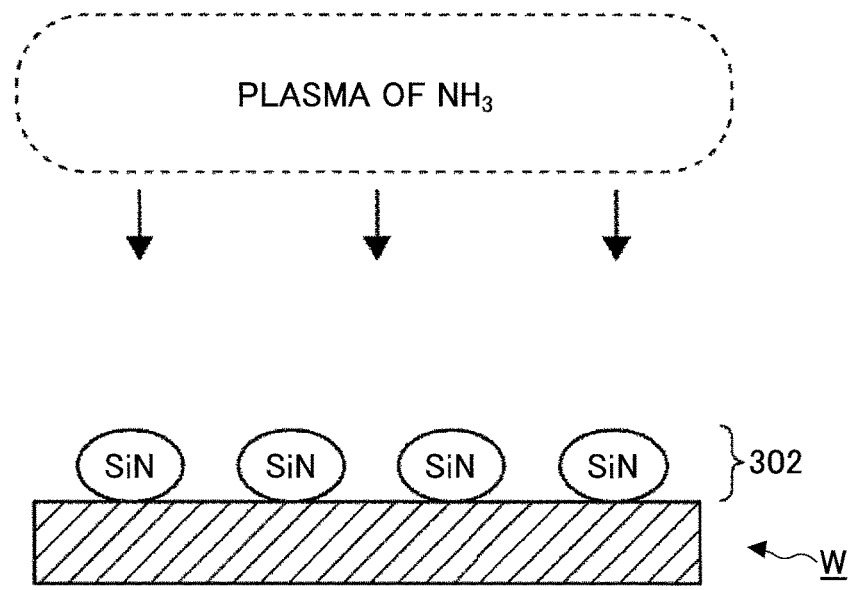
FIG. 10 is a vertical cross-sectional view schematically illustrating the function of the film deposition apparatus.
Figure 11:
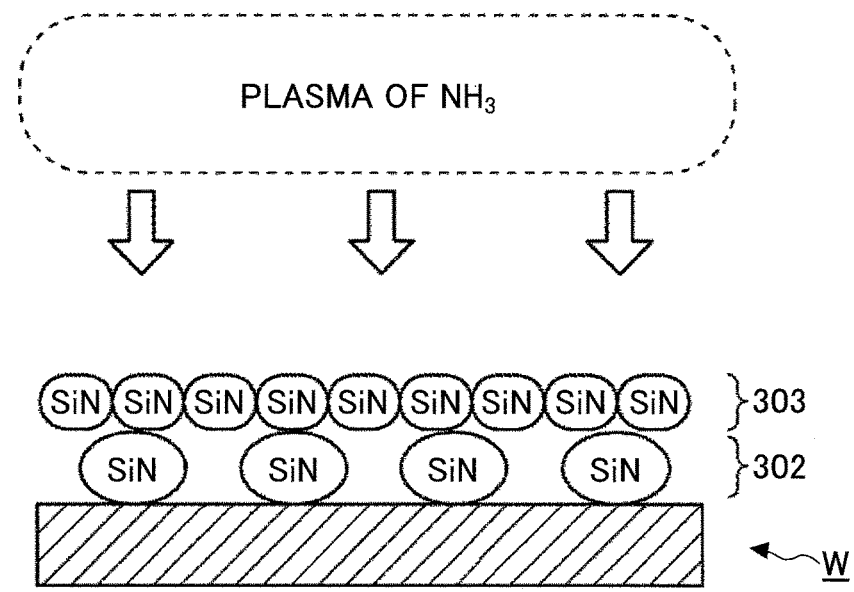
FIG. 11 is a vertical cross-sectional view schematically illustrating the function of the film deposition apparatus.

The first film 302 is not so much densified because the rotational speed of the turntable is set to be a relatively high speed of about 30 rpm. As described in detail, because the wafer W on the turntable 2 quickly passes through the second process area P2, the staying time of the wafer W in the process area P2 is extremely short. Therefore, the wafer W is not nitride so strongly by the plasma of the ammonia gas. As schematically illustrated in FIG. 10, the first film 302 is structured so that silicon nitride molecules are sparsely arranged. Therefore, a difference of the stress of the first film 302 from the stress of the wafer W (specifically, the nitride layer 301) on the lower side of the first film 302 is not so great. Referring to FIG. 10, the illustration of the nitride layer 301 is omitted, and so in FIG. 11 described below.

Said differently, if the dense silicon nitride film is formed on the surface of the wafer W, the film peeling of the silicon nitride film is apt to occur by the internal stress of the silicon nitride film.

However, if the silicon nitride film is sparsely dispersed as in the first film 302, a great stress is not generated in the inside of the first film 302. Further, the silicon nitride molecules easily move inside the first film 302 thereby relieving the stress. Therefore, the first film 302 contacts the wafer W on the lower layer side with a good contact property. As described, an adsorption process of the component of the dichlorosilane gas and a nitriding process of this component are repeatedly performed by a predetermined number of times thereby laminating the first film 302 so as to have a film thickness of about 5 nm. This process of depositing the first film 302 is called a "first process". Further, the first film 302 functions as a stress relieving layer.

Thereafter, at a time t4, the rotational speed of the turntable 2 is changed to a low speed of 10 rpm and a large number of steps of depositing films is provided to the wafers W.

As described, a staying time of the wafer W in the second process area P2 becomes longer than the first process described above and the supply quantity of the plasma (the active species) of the ammonia gas increases because the rotational speed of the turntable 2 is set to be low. This process of depositing the film while setting the rotational speed of the turntable 2 to be low is called a "second process". Said differently, the amount of the active species of the ammonia gas supplied to the wafers W in the steps of depositing the film in the second step is greater than the amount of the active species of the ammonia gas supplied to the wafers W in the steps of depositing the film in the first step. Therefore, the amount of the active species supplied per a unit film thickness is greater in the second process than in the first process. When the first and second films 302 and 303 having an identical arbitrary film thickness are compared, the amount of the active species supplied to the second film 303 through the entire film thickness is greater than the amount of the active species supplied to the first film 302 through the entire film thickness.

Therefore, the silicon nitride film deposited in the second process becomes a second film (a dense layer), which is more dense than the first film 302 on the lower layer side. This second film 303 has an extremely great stress difference from a silicon layer. As described, because the first film 302 is interposed between the second film 303 and the wafer W, the stress difference between the second film 303 and the wafer W is relieved to restrict the film peeling of the second film 303. By repeating the steps of depositing the film, a thin film is formed by the first film 302 and the second film 303. The film thickness of the second film 303 is, for example, 15 nm to 50 nm. Therefore, a ratio of the film thickness of the first film 302 relative to the entire film thickness of the thin films (the total film thickness obtained by adding the first and second films 302 and 303) is 10% to 25%.

According to the above embodiment, when the thin film made of the silicon nitride film is formed by performing the steps of depositing the film by alternately supplying the dichlorosilane and the plasma of the ammonia gas by a great number of times, the thin film is formed by the first film 302 on the lower layer side and the second film 303 of the upper layer side. The amount of the active species supplied to the wafer W in the step of depositing the film at a time of depositing the first film 302 is smaller than the amount of the active species supplied to the wafer W in the step of depositing the second film 303. Therefore, when the second film 303, which has a good density and also has the internal stress greatly different from that of the wafer W, is deposited, the stress difference between the second film 303 and the wafer W can be relieved. Therefore, while suppressing the film peeling of the thin film, the second film 303 having a good density can be formed on the exposed surface (the uppermost layer) of the wafer W.

Further, because the turntable 2 is rotated faster in the first process than in the second process, the film deposition rate of the first process is faster than the film deposition rate of the second process.

Therefore, the thin film can be quickly deposited in comparison with the case where the turntable 2 is rotated at the rotational speed similar to that in the second process from the initial stage of depositing the film to the final stage of depositing the film. FIG. 13 illustrates time-series data such as a gas flow rate and a plasma power in a case of depositing the thin film having an arbitrary film thickness using a conventional process of depositing the film having only one stage. In comparison with FIG. 6 described above, a time required for a process of depositing the film is longer than that in the embodiment of the present invention.

Because the outermost surface of the silicon nitride film described above has the second film 303, it is possible to preferably apply to a device where an anti-etching property to a hydrofluoric acid such that the silicon nitride film is used as the etching stopper film. Even though the first film 302 having a lower density than that of the second film 303 is deposited on the lower layer side of the thin film, the first film 302 is not exposed on the surface of the thin film. Further, because the film thickness of the first film 302 is extremely thinner than the film thickness of the entire thin film, the thin film obtained according to the embodiment of the present invention can preferably function as the etching stopper film.

As described, the plasma process at the time of depositing the first film 302 as the stress relieving layer is performed in a state where the supply quantity of supplying the active species to the wafer W during one cycle of the ALD is smaller than that in the plasma process at the time of depositing the second film 303 as the dense layer. The embodiment makes a state where the supply quantity of the active species to the wafer W per one cycle of the ALD is small by increasing the rotational speed of the turntable 2 at the time of depositing the first film 302 more than the rotational speed at the time of depositing the second film 303.

However, the supply quantity (an adjusted value of a controlled parameter) of supplying the active species to the wafer per one cycle of the ALD can be adjusted not only by adjusting the rotational speed of the turntable 2. An adjusted parameter of the supply quantity of the active species is a pressure (a degree of vacuum) of an area where the plasma is generated, the flow rate of the ammonia gas, a distance between the antenna 83 for generating the antenna 83 and the wafer W, a power supplied to the antenna 83, and addition of hydrogen ($H_2$) gas.

In this case, in order to decrease the supply quantity of the active species at the time of forming the first film 302 relative to the supply quantity of the active species at the time of forming the second film 303, there are adjustments such as a decrement of the supply quantity of the active species, an increment of the pressure, a decrement of the flow rate of the ammonia gas, an increment of the distance, a decrement of the supply power, and a decrement of the additive amount of the hydrogen gas. A plurality of the adjustments may be combined.

Specifically, the stress inside the thin film turns in a compressive direction by increasing the additive amount of the hydrogen gas as illustrated in FIG. 28 described below. The DCS gas as the first process gas for depositing the silicon nitride film contains an element of chlorine (Cl). Therefore, when the DCS gas is used to deposit the silicon nitride film, there is a possibility that chlorine is taken into the silicon nitride film as an impurity. Therefore, when the hydrogen gas is added to the second process gas, chlorine contained in the thin film desorbs by a function of the active species of the hydrogen gas so as to be a pure (dense) nitride film.

Figure 14:
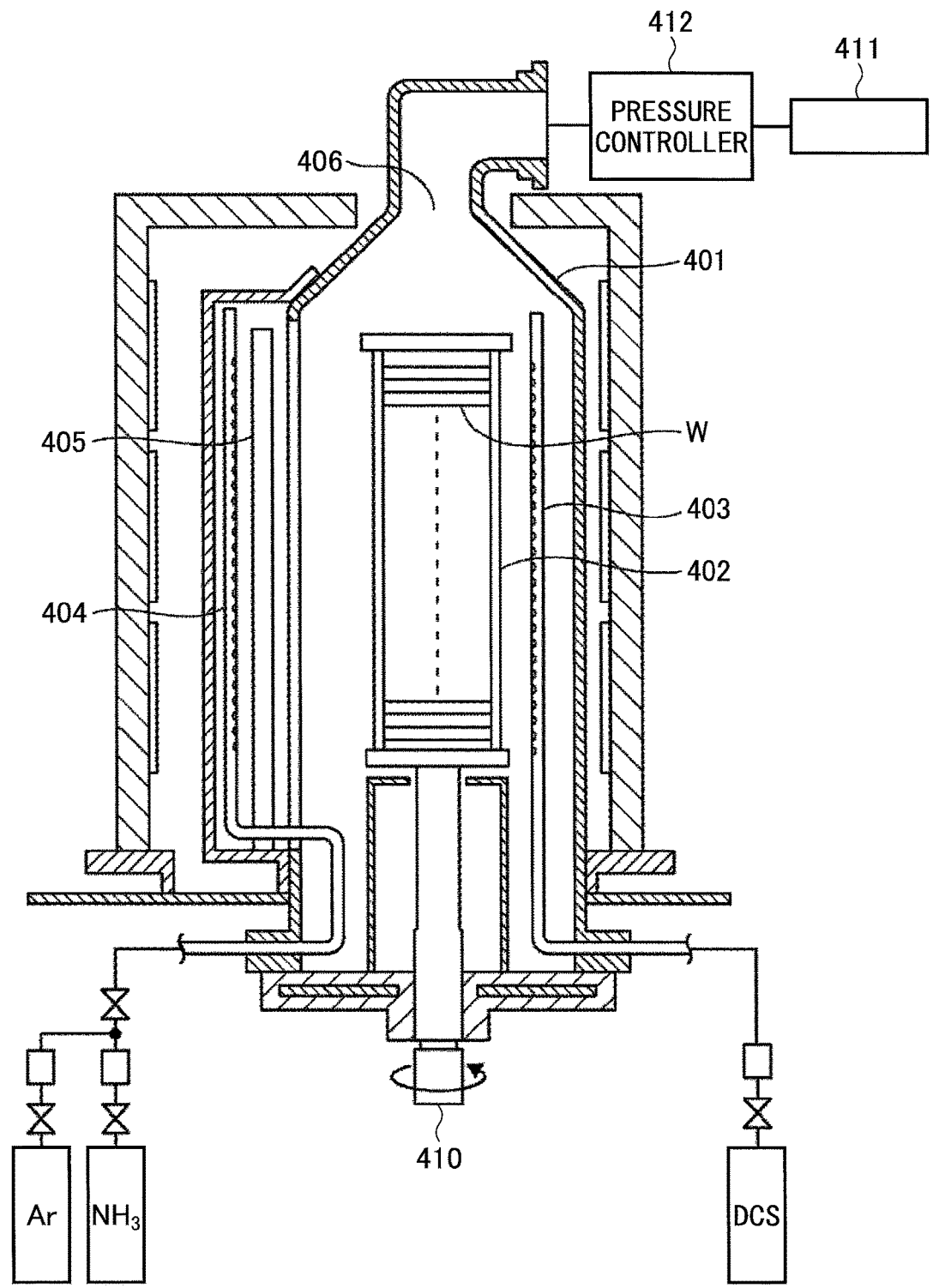
FIG. 14 is a vertical cross-sectional view of a film deposition apparatus of another embodiment of the present invention.
Figure 15:
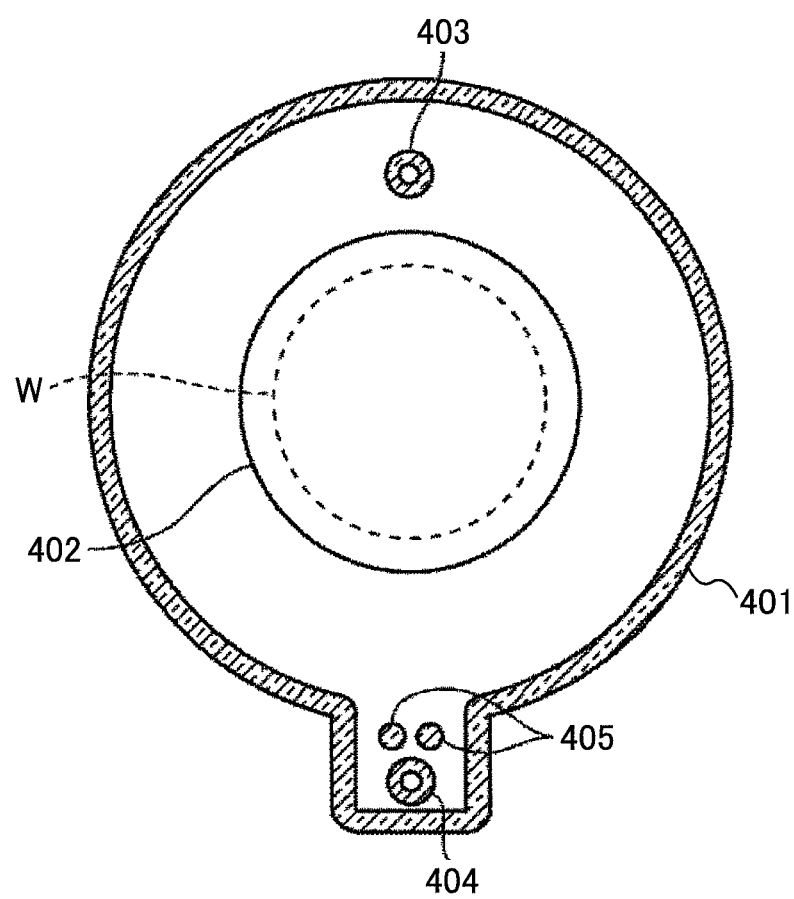
FIG. 15 is a horizontal cross-sectional plan view of the film deposition apparatus of the other embodiment of the present invention.

As an apparatus of performing a method of depositing the film of the embodiment of the present invention, in place of the apparatus of a mini batch type described above, there may be provided an apparatus of a sheet-feed type, or an apparatus of a batch type where the film is simultaneously deposited onto plural sheets of wafers W. FIGS. 14 and 15 illustrate a vertical thermal treatment apparatus of the batch type. A wafer boat 402 loading a great number of wafers W like a shelf is hermetically accommodated inside the reaction tube 401 from the lower side of the reaction tube 401.

Two gas injectors 403 and 404 are accommodated inside the reaction tube 401 and arranged along the length direction of the reaction tube 401 so that the two gas injectors 403 and 404 face each other while interposing the wafer boat 402 between the two gas injectors 403 and 404. A pair of electrodes 405 and 405, to change the ammonia gas to the plasma, are arranged between the gas injector 404 for supplying the ammonia gas as the second process gas and the wafer boat 402.

In the vertical thermal treatment apparatus, after supplying the dichlorosilane gas from the gas injector 403 to the wafers W, an atmosphere of the reaction tube 401 is evacuated from an evacuation port 406 provided in an upper end portion of the reaction tube 401, and the plasma of the ammonia gas is supplied to the wafers W to perform the step of depositing the film described above. The amount of the active species supplied to the wafer W at the time of depositing the first film 302 is smaller than the amount of the active species of the ammonia gas supplied to the wafer W at the time of depositing the second film 303. Referring to FIG. 14, a reference symbol 410 designates a motor for rotating the wafer boat 402 around the vertical axis, a reference symbol 412 designates a pressure controller, and a reference symbol 411 designates a vacuum pump.

Further, in the above examples, a reforming region where a plasma reformulation process is performed may be provided at a position on the downstream side of the second process area P2 in the rotational direction of the turntable 2 and at a position on the upstream side of the first process area P1 in the rotational direction of the turntable 2. Said differently, members such as the plasma process portion 80 (the antenna 83) and the casing 90 may be additionally provided at a position on the upstream side of the transfer opening 15 in the rotational direction of turntable 2 to supply the active species of the ammonia gas at the position on the upstream side of the transfer opening 15 in the rotational direction of turntable 2.

The plasma reformulation process described above is performed in the plasma process portion 80 positioned on the downstream side of the transfer opening 15 in the rotational direction of the turntable 2. Said differently, the plasma reformulation process is performed by changing a plasma generation gas such as an argon gas or the plasma generation gas and the second process gas (the ammonia gas) to the plasma and supplying the plasma (the active species) obtained thereby to the wafer W. The plasma supplied to the wafer W in the plasma reformulation process corresponds to the active species pertinent to the quality of the thin film. Therefore, at the time of depositing the thin film on the surface of the wafer W, the active species are at least the active species obtained by changing the second process gas to the plasma or the active species obtained by changing the plasma generation gas supplied to the wafer W at the time of reforming the thin film (the reaction product).

The thin film described above may be a nitride film such as a titanium nitride (TiN) film or the like or a silicon oxide film (a $SiO_2$ film). At the time of depositing the silicon oxide film, the plasma (the active species), such as an oxygen ($O_2$) gas and an ozone ($O_3$) gas, is supplied to the wafer W in the second process area P2. In a case where the plasma reformulation process described above is performed to deposit the silicon oxide film, an ozonizer may be used to generate the ozone gas instead of changing the ozone gas to the plasma using the antenna in order to generate the active species of the second process gas (the ozone gas).

Further, a chemical vapor deposition (CVD) method may be used as a method of depositing the thin film on the wafer W in place of the ALD method. Said differently, the thin film may be deposited by simultaneously supplying the first process gas described above and the plasma obtained by changing the second process gas to the plasma. In this case also, the adjusted value of the controlled parameter is adjusted so that the amount of the active species supplied to the wafer W per a unit film thickness at the time of depositing the first film 302 becomes smaller than the amount of the active species supplied to the wafer W per a unit film thickness at the time of depositing the second film 303.

In a case where a CVD method is used, a metallic film such as a tungsten (W) system may be deposited. At the time of depositing the metallic film, for example, a hydrogen ($H_2$) gas or a silane (Si—H compound) gas is used as the second process gas and changed to plasma. Further, the underlayer, on which the thin film is deposited, may be the nitride film, the metallic film, the silicon oxide film, or the like deposited on the surface of the wafer W, in place of the wafer W made of silicon.

EXAMPLES

Next, examples obtained in the embodiment of the present invention are described. At first, FIGS. 16 and 17 illustrates a dense silicon nitride film formed by the conventional process of depositing a film having one stage. A great number of film peelings substantially in a circular shape having a diameter of about several dozen μm are produced. The film peelings seem to be produced by a reason that a compression stress of causing a film to contract in horizontal directions is generated inside the silicon nitride film and the stress becomes greater than a contact force between the silicon nitride film and the wafer W.

Tests were performed to know changes to the film peelings when the amount of the active species of the ammonia gas that is supplied to the wafer W is variously changed. Specifically, a distribution of the film peelings produced on the surface of the wafer W was observed when the distance between the wafer W on the turntable 2 and the lower surface (the lower surface of the casing at the lower position of the antenna 83) of the casing 90 was variously changed. Film deposition conditions other than the distance were set to be conditions common to the examples.

Figure 18:
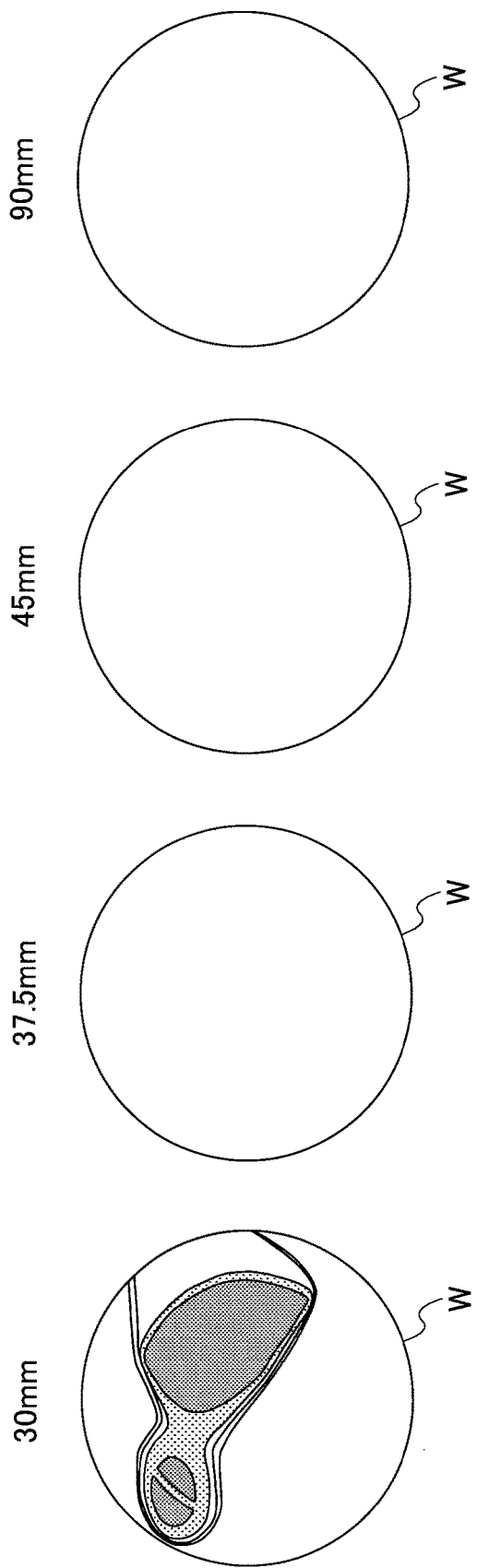
FIG. 18 schematically illustrates results obtained by the embodiment of the present invention.
Figure 19:
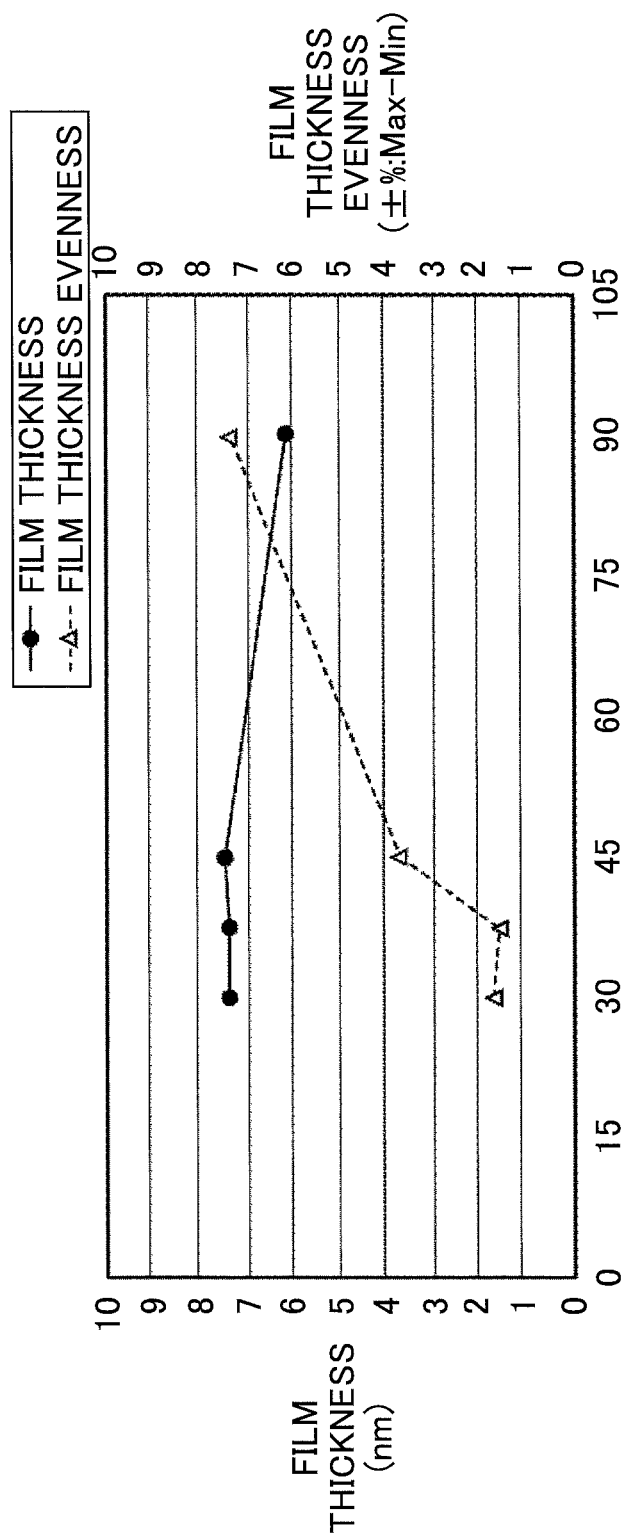
FIG. 19 is a characteristic chart illustrating results obtained by the embodiment of the present invention.

As a result, as illustrated in FIG. 18, when the casing 90 was brought closer to the turntable 2 so that the distance becomes 30 mm, the film peelings were produced. On the other hand, as illustrated in FIG. 19, the evenness of the film thicknesses was better as the distance was smaller. The reason is presumed that a plasma region contacting the wafer W expanded when the casing 90 was brought closer to the wafer W, and the good plasma process is performed through the surface of the wafer W. Therefore, it was known that the amount of the active species of the ammonia gas supplied to the wafer W can be adjusted by adjusting the height of the casing 90. The film thickness of the thin film becomes good in a case where the distance is set to be 45 mm or less than in a case where the distance is set to be 90 mm. Referring to FIG. 18, shaded areas on the surface of the wafer W correspond to film peelings. The shade is darkened as the produced amount of the film peelings per a unit area becomes greater, and so in FIG. 20 described below.

Figure 20:
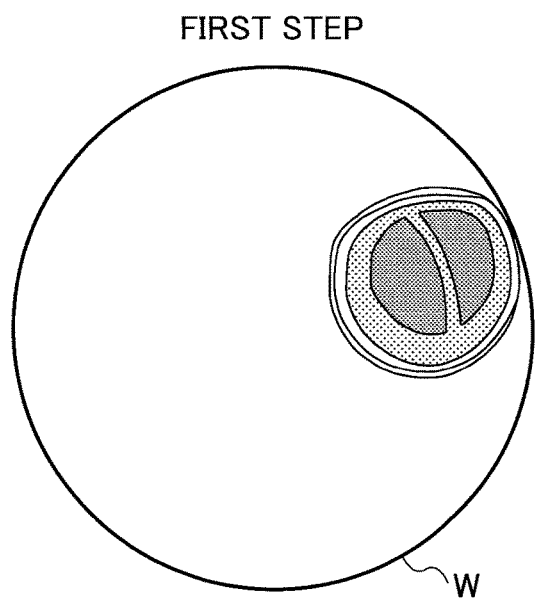
FIG. 20 schematically illustrates results obtained by the embodiment of the present invention.
Figure 21:
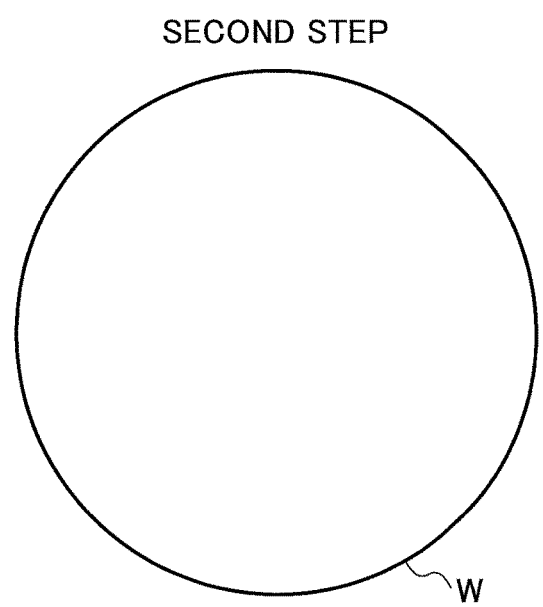
FIG. 21 schematically illustrates results obtained by the embodiment of the present invention.

The film peelings are produced as illustrated in FIG. 20 when the supply quantity of the active species of the ammonia gas was set to be as much as possible, the distance was set to be 37.5 mm, the degree of the vacuum inside the vacuum chamber is increased, the power supplied to the antenna 43 was increased, and the other conditions were set to be the same as the conditions without producing the film peels in the above. Therefore, it is known that the film peelings of the silicon nitride film are apt to be produced as the supply amount of the active species increase.

At this time, when the above-described first film 302 was deposited on the lower layer side of the thin film before performing the process of depositing the thin film with the conditions in FIG. 20, the film peelings were not produced. Further, the film thickness evenness of the film thicknesses was also improved. Therefore, good results were obtained for both of the production of the film peelings and the film thickness evenness of the film thicknesses by providing the sequence of depositing the films having the above-described two stages.

Figure 22:
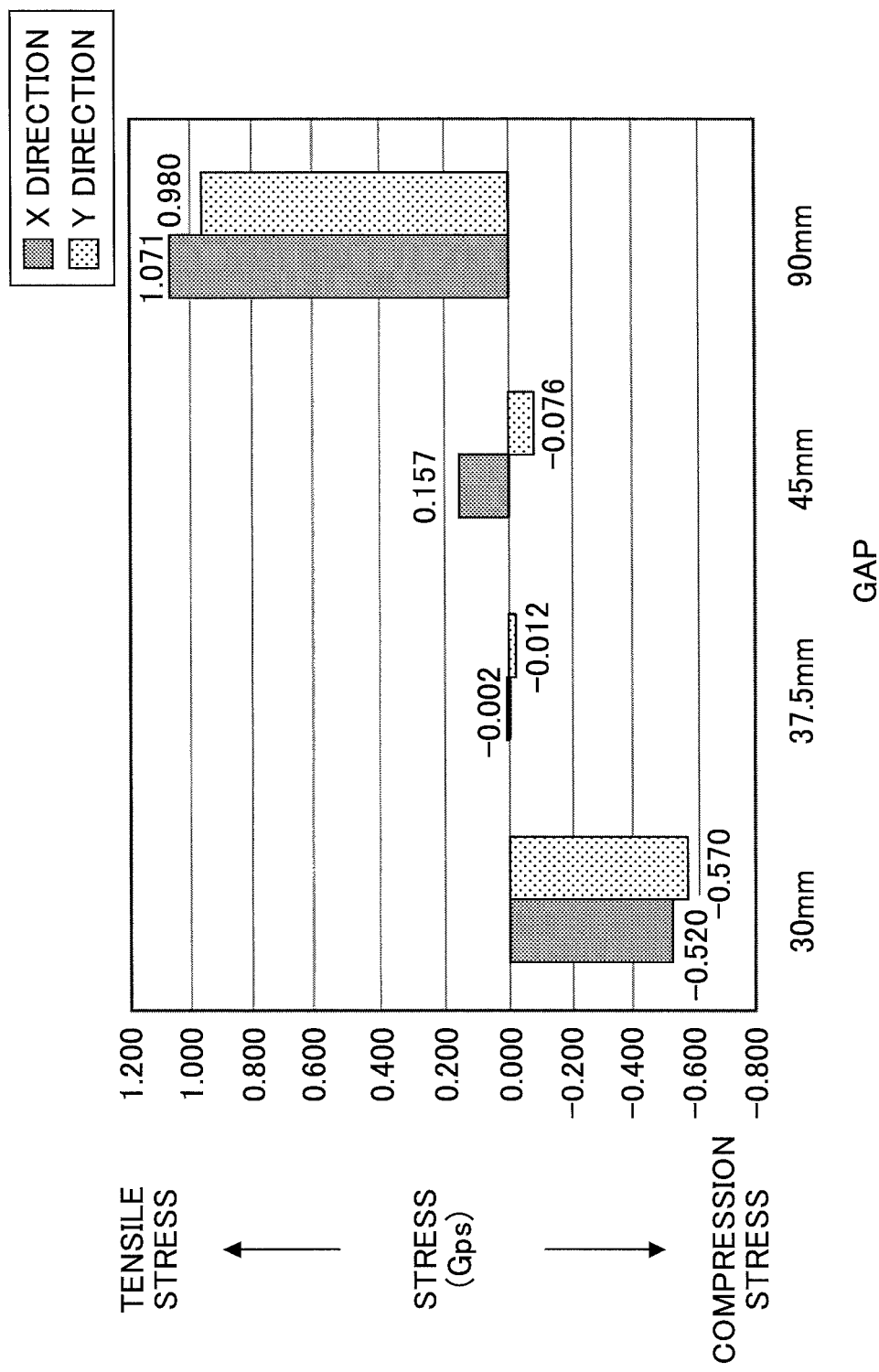
FIG. 22 is a characteristic chart illustrating results obtained by the embodiment of the present invention.

FIG. 22 illustrates measurement results showing whether a stress inside the silicon nitride film was a compression stress or a tensile stress when the silicon nitride film was deposited by variously changing the above-described distance (the distance between the casing 90 and the turntable 2: a gap). As a result, it was known that the stress inside the silicon nitride film was changed depending on the gap. Resultantly, it is known that the film peelings are produced by the compression stress generated inside the thin film.

Figure 23:
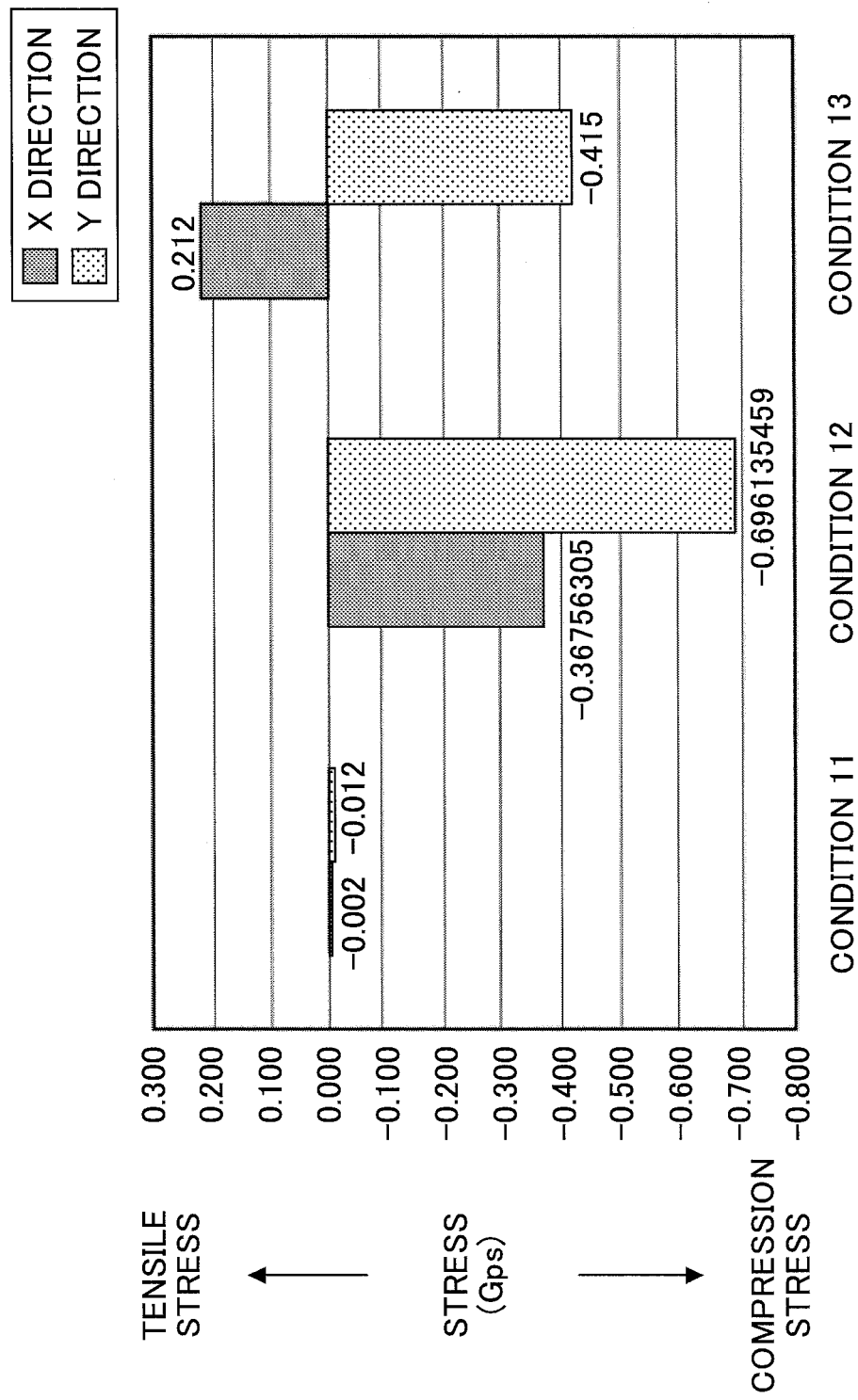
FIG. 23 is a characteristic chart illustrating results obtained by the embodiment of the present invention.

Further, FIG. 23 illustrates the stress produced at the time of depositing the silicon nitride films in the following conditions 11, 12, and 13.

(Condition 11)
  Second process gas: an ammonia gas (3.5 slm)
  High frequency power: 4.5 kW
  Rotational speed of turntable 2: 10 rpm
(Condition 12)
  Second process gas: an ammonia gas (7 slm), and an argon gas (1 slm)
  High frequency power: 5 kW
  Rotational speed of turntable 2: 10 rpm
(Condition 13)
  Second process gas: an ammonia gas (3.5 slm)
  High frequency power: 4.5 kW
  Rotational speed of turntable 2: 5 rpm From these results, it is known that the stress inside the silicon nitride film changes depending on the component of the plasma generating gas (the second process gas), the flow rate of the second process gas, the rotational speed of the turntable 2, and the high frequency power for generating the plasma.

Figure 24:
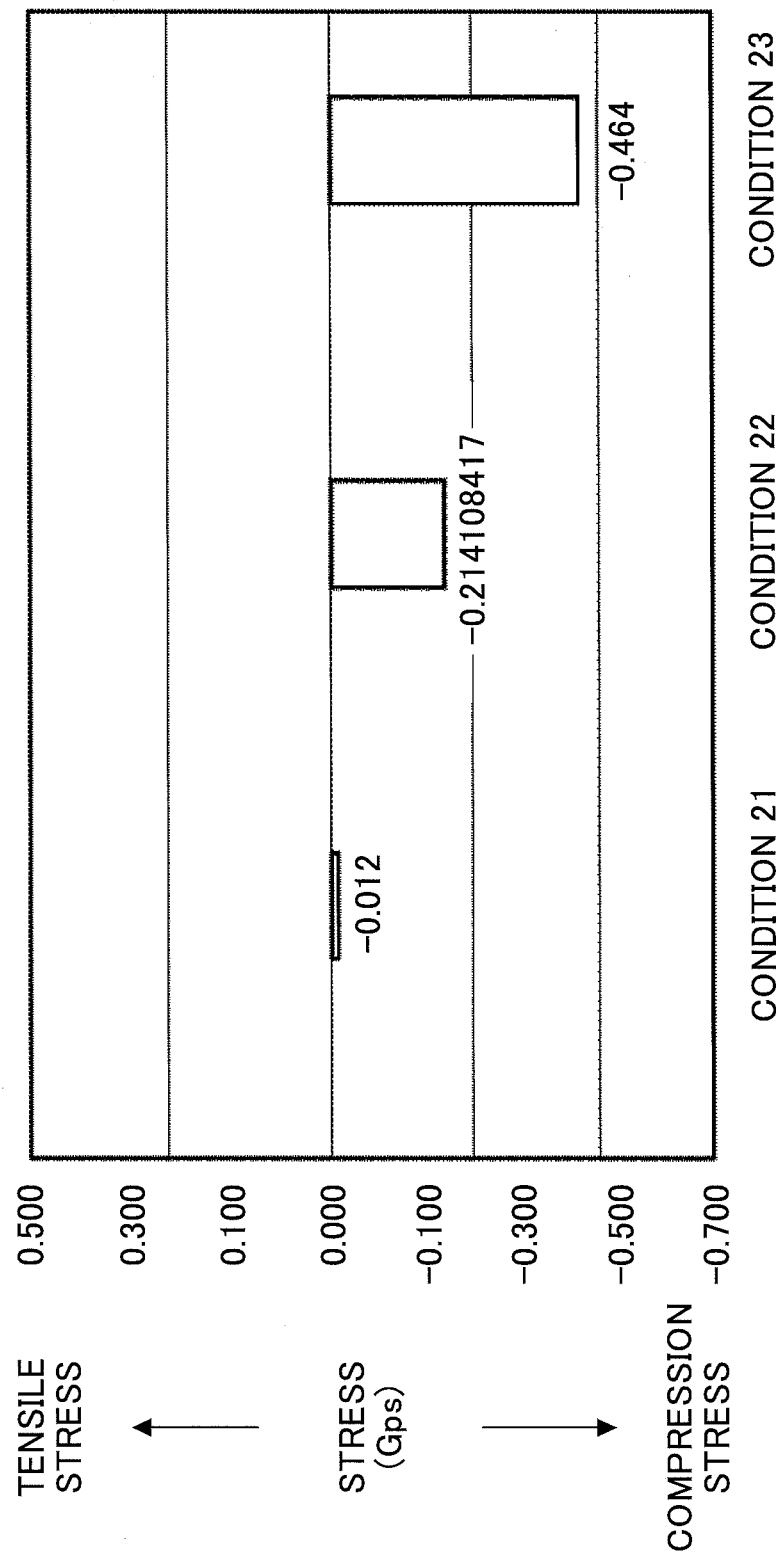
FIG. 24 is a characteristic chart illustrating results obtained by the embodiment of the present invention.

FIG. 24 illustrates measurement results obtained by measuring the stress inside silicon nitride films at the time of depositing films with conditions 21, 22, and 23.
(Condition 21: Process of Depositing Film Having One Stage)
  Second process gas: an ammonia gas (5 slm)
  High frequency power: 4.5 kW
  Rotational speed of turntable 2: 10 rpm
(Condition 22: Process of Depositing Film Having Two Stages)
  Second process gas: an ammonia gas (8 slm)
  High frequency power: 5 kW
  Rotational speed of turntable: 30 rpm (1st stage) and 10 rpm (2nd stage)
(Condition 23: Process of Depositing Film Having One Stage)
  Second process gas: an ammonia gas (8 slm)
  High frequency power: 5 kW
  Rotational speed of turntable 2: 10 rpm With this condition, after depositing a sparse film by setting a rotational speed of the turntable 2 of 30 rpm in the first stage, a rotational speed is changed to a low speed. Thus, a possibility of adsorbing the ammonia gas becomes high to thereby enabling deposition of a dense thin film (the second film 303). According to these results, the stress inside the silicon nitride film was changed by the flow rate of the second gas and the high frequency power. Further, the stress inside the silicon nitride film was changed in a manner similar thereto by interposing another silicon nitride film (the first film 302) between the silicon nitride film of the upper layer side and the wafer W. Said differently, it is possible to deposit the thin film (the first film 302 and/or the second film 303) having an arbitrary (predetermined) stress by appropriately setting each of the rotational speed of the turntable 2, the flow rate of the second gas, and the high frequency power.

Figure 25:
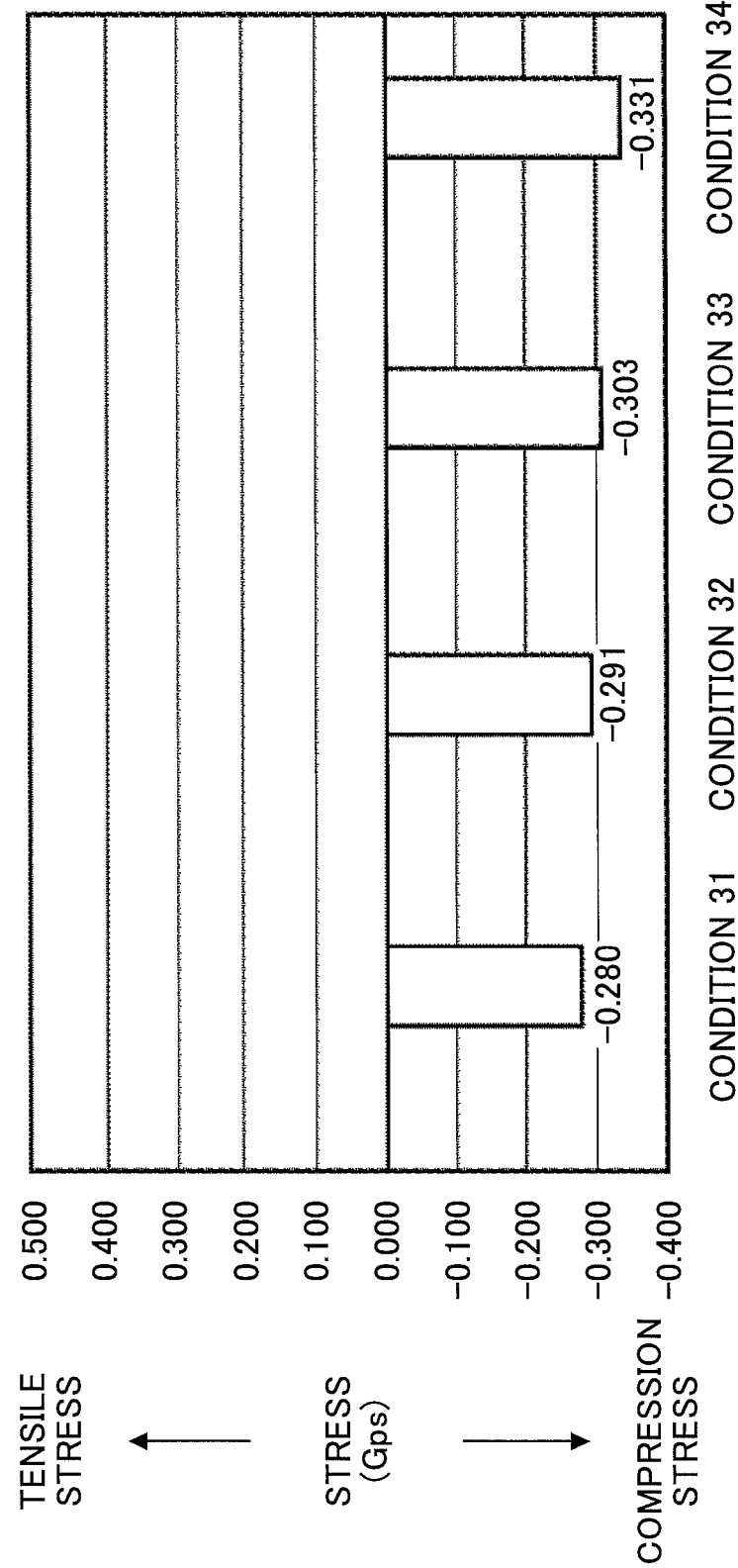
FIG. 25 is a characteristic chart illustrating results obtained by the embodiment of the present invention.

FIG. 25 illustrates measurement results obtained by measuring the stress produced inside silicon nitride films when a heating temperature of wafers W was set to be 400° C. (Conditions 31 and 32) and 450° C. (Conditions 33 and 34), and the film thicknesses of the silicon nitride films were set to be 50 nm (Conditions 31 and 33) and 25 nm (Conditions 32 and 34). It was known that the heating temperature and the film thickness of the silicon nitride film caused the stress to be changed in a manner similar to the above.

Figure 26:
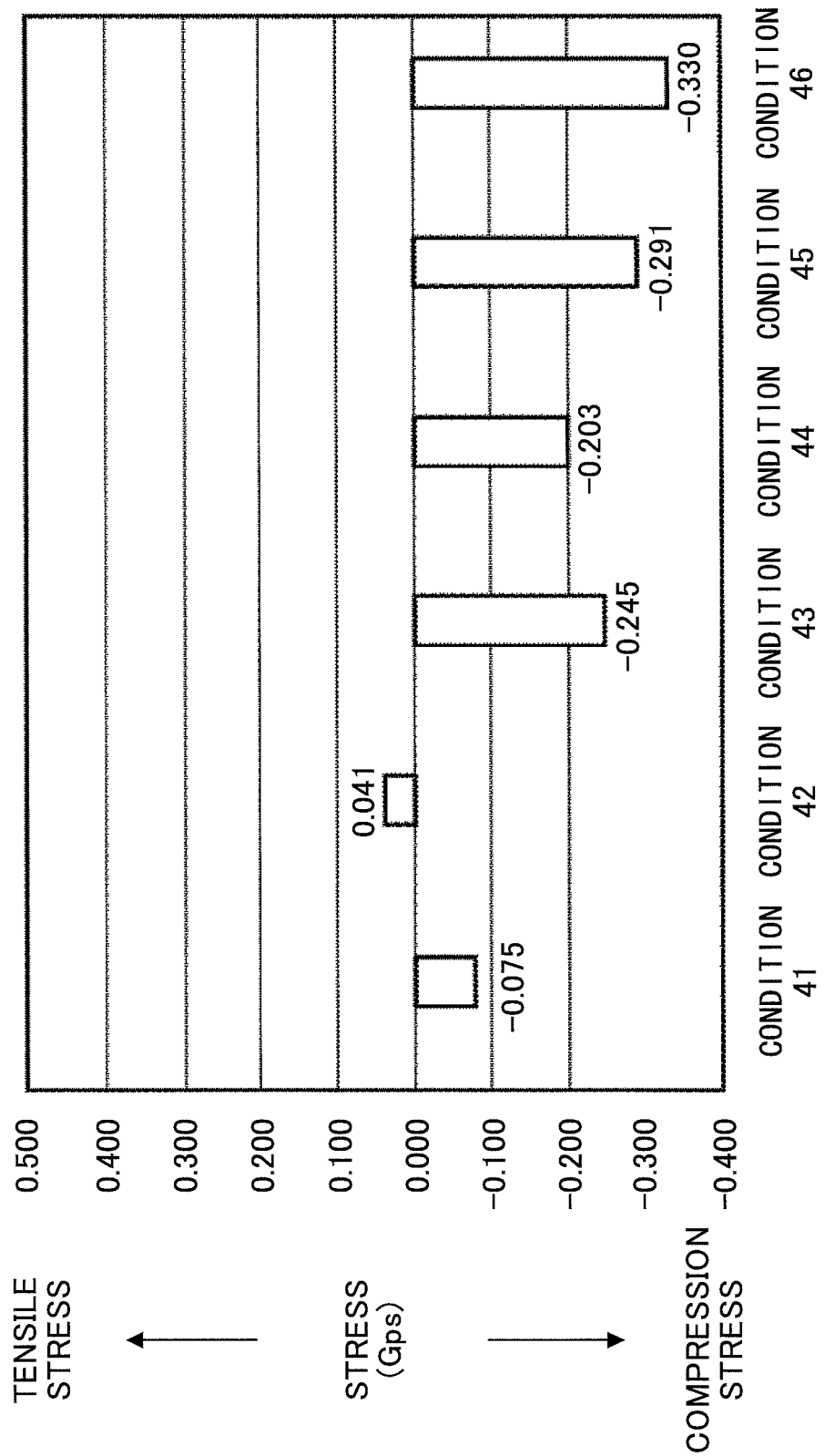
FIG. 26 is a characteristic chart illustrating results obtained by the embodiment of the present invention.

FIG. 26 illustrates measurement results obtained by measuring the stress inside a silicon nitride film caused by the heating temperature of the wafer W when the film thickness of the silicon nitride film is fixed to 25 nm. Specifically, the heating temperature is increased every 50° C. from 200° C. in the order of Condition 41 to Condition 46. In FIG. 26, results similar to those in FIG. 5 were obtained.

Figure 27:
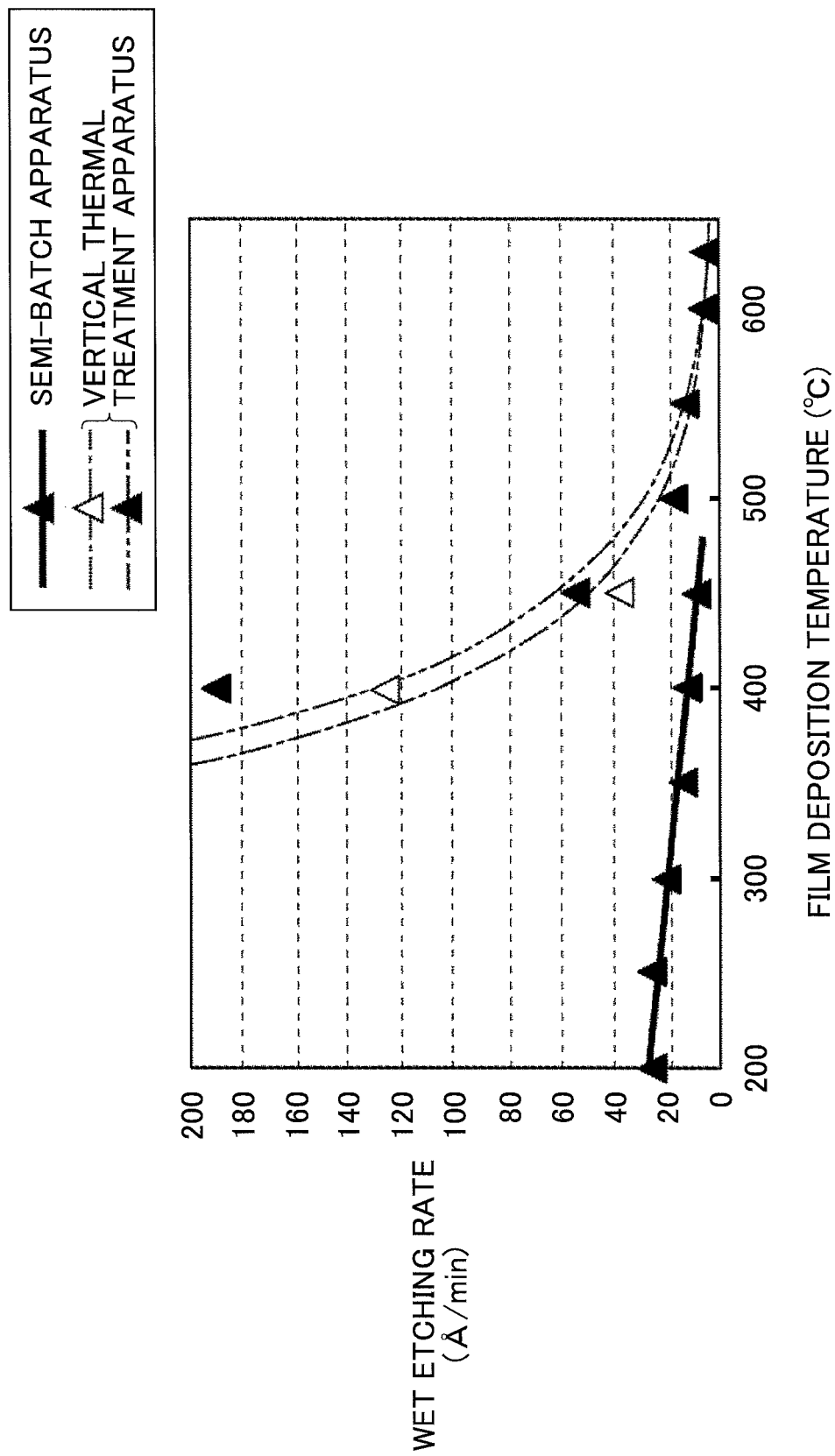
FIG. 27 is a characteristic chart illustrating results obtained by the embodiment of the present invention.

FIG. 27 illustrates a result of interrelation between the film deposition temperature of a silicon nitride film and the wet etching rate of the silicon nitride film for a hydrofluoric acid. A semi-batch apparatus illustrated in FIG. 1 and a vertical thermal treatment apparatus of a batch type illustrated in FIG. 14 are tested to perform processes of depositing films of the ALD method. It was known that a silicon nitride film having properties of the same level as properties obtained by the vertical thermal treatment apparatus at a temperature of 550° C. was obtained in the semi-batch apparatus at a temperature of 400° C. In any apparatuses, it is known that the wet etching rate becomes lower as the film deposition temperature becomes higher, and therefore the silicon nitride film becomes more dense as the film deposition temperature becomes higher.

Therefore, the second film 303 becomes more dense than the first film 302 by increasing the film deposition temperature in depositing the second film 303 to be higher than a case where the first film 302 is deposited. Said differently, a stress relieving layer which is softer that the second film 303 can be formed on the lower layer side of the second film 303. Therefore, an effect the same as the above example is obtainable. As described, in a case where the film deposition temperature is increased during the period when the thin film is being deposited, the process of depositing the film is performed at, for example, 200° C. at the beginning of the film deposition (at the time of depositing the first film 302). Subsequently, after the film deposition proceeds to deposit a thickness corresponding to the film thickness of the first film 302, the film deposition temperature is increased to be, for example, 400° C., and the second film 303 is deposited.

FIG. 28 illustrates measurement results obtained by measuring the stress remaining in silicon nitride films in a case where the silicon nitride films were deposited with the following conditions. The process pressure and the supply power to the antenna were set to be 93.3 Pa (0.7 Torr) and 5000 W in any examples of Conditions 51 to 53. The distance between the casing 90 and the turntable 2 is set to be 30 mm in Conditions 51 to 53.
(Condition 51)
Second process gas: ammonia/hydrogen-5000 sccm/0 sccm
(Condition 52)
Second process gas: ammonia/hydrogen=5000 sccm/600 sccm
(Condition 53)
Second process gas: ammonia/hydrogen=300 sccm/600 sccm As a result, it is known that the silicon nitride film becomes more dense as the additive amount (a ratio of the hydrogen gas contained in the entire second process gas) increases, and therefore the density of the thin film can be adjusted by the additive amount (the amount of the active species of the hydrogen gas). In a case where the densities of the first and second films 302 and 303 are adjusted, the following method is specifically applied. When only the first film 302 is deposited, only the ammonia gas is used without using the second process gas being, for example, a hydrogen gas. When the second film 303 is deposited, an ammonia gas added with a hydrogen gas is used as the second process gas. Said differently, effects similar to the above examples are obtained by increasing the additive amount of the hydrogen gas (the ratio of the added hydrogen gas in the second process gas) used at the time of depositing the second film 303 in comparison with the second process gas used at the time of depositing the first film 302. Test results in FIG. 28 or the like are obtained with various conditions. It is natural that various results are obtained in a case where parameters such as the process pressure and the gas flow rate are appropriately changed.

According to the embodiment of the present invention, in forming the thin film on the substrate by supplying the active species contributing the quality of the thin film, the lower side portion of the thin film is formed of the first film (the stress relieving layer) and second film (the dense layer) is formed on the upper side of the lower side portion as a part of the thin film. Further, the amount of the active species per a unit of the film thickness of the first film supplied to the substrate at the time of depositing the first film is decreased in comparison with the active species per a unit film thickness supplied to the substrate at the time of depositing the second film. Therefore, even if the film peeling of the second film is ready to be produced by the difference between the stresses of the substrate and the second film, the first film can relieve the difference of the stresses. Therefore, it is possible to deposit the thin film having a good film quality (a dense thin film) while preventing the film peeling.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of depositing the film has been described in detail, it should be understood that the various changes, substitutions, and alterations could be made hereto without departing from the spirit and scope of the invention.

What is claimed is:

1. A method of depositing a thin film on a substrate provided on a turntable inside a vacuum chamber comprising:
a first process that deposits a first film on the substrate, the first process including a process of supplying an active species that is obtained by changing a gas to plasma and is related to a quality of the thin film to the substrate; and
a second process that deposits a second film that is the same type as that of the first film on the first film, the second process including a process of supplying the active species to the substrate so that a supply quantity of the active species per a unit film thickness is greater than a first supply quantity of the active species per the unit film thickness in the first process by adjusting a controlled parameter, said controlled parameter includes an additive amount of hydrogen gas,
wherein a thickness of the first film is 10-25% of a total thickness of the first and second films,
wherein the plasma used in the first and second processes is produced by supplying electric power from an electric power supply unit to the gas, said electric power supply unit having a casing that contains an antenna, a faraday shield and an insulating plate,
wherein the adjusting the controlled parameter includes making a distance between the electric power supply unit and the substrate in the first process greater than the distance between the electric power supply unit and the substrate in the second process, said distance being changed by a driving unit by vertically and integrally moving the casing together with the antenna, the faraday shield and the insulating plate, wherein the controlled parameter also includes decreasing a rotational speed of the turntable during a transition from the first process to the second process while maintaining the electric power of the plasma consistent during the transition from the first process to the second process, and wherein the rotational speed is decreased from 30 rpm to 10 rpm, and the distance between the electric power supply unit and the substrate is decreased under 45 mm during the transition from the first process to the second process.

2. The method of depositing the thin film according to claim 1, wherein, in each of the first and second processes, a first process gas and a second process gas that produces a reaction product on the substrate by reacting with the first process gas are alternately supplied onto the substrate, wherein at least one of the first and second process gases is supplied as the plasma, which is obtained by changing the first or second process gas.

3. The method of depositing the thin film according to claim 2, wherein, in each of the first and second processes, the substrate is orbitally revolved by rotating a turntable, on which the substrate is mounted, the first process gas is supplied in a first process area, and the second process gas is supplied in a second process area, the first process area and the second process area being mutually separated in a peripheral direction of the turntable.

4. The method of depositing the thin film according to claim 1, wherein, in each of the first and second processes, a first process gas and a second process gas that produces a reaction product on the substrate by reacting with the first process gas are alternately supplied onto the substrate, wherein, between supplying the first process gas and supplying the second process gas, a reformation gas for reforming the thin film is changed to the plasma to obtain a reformulation active species, and the reformulation active species are supplied to the substrate.

5. The method of depositing the thin film according to claim 1, wherein each of the first and second processes is a process of depositing a film using a plasma CVD method.

6. The method of depositing the thin film according to claim 1, wherein the adjusting the controlled parameter is performed by at least one of a) and b):

a) making a pressure of a process atmosphere in the first process higher than the pressure of the process atmosphere in the second process, and b) making a flow rate of the gas to be changed to the plasma in the first process lower than the flow rate of the gas to be changed to the plasma in the second process.

7. The method of depositing the thin film according to claim 1, wherein the first and second films are a silicon nitride film, and an underlayer of the first film is a silicon film.

8. The method of depositing the thin film according to claim 7, wherein the active species in each of the first and second processes are obtained by changing an ammonia gas to the plasma.

9. The method of depositing the thin film according to claim 1, wherein the additive amount of hydrogen gas is increased in the second process.

10. The method of depositing the thin film according to claim 1, wherein the second film has a density that is higher than that of the first film.

11. The method of depositing the thin film according to claim 1, wherein the vacuum chamber has a ceiling plate that has an opening where the casing is provided so as to be vertically and integrally moved together with the antenna, the faraday shield and the insulating plate by the driving unit within the opening of the ceiling.

* * * * *